US008545119B2

(12) United States Patent
Ookouchi et al.

(10) Patent No.: US 8,545,119 B2
(45) Date of Patent: Oct. 1, 2013

(54) SUBSTRATE CLEANING APPARATUS, COATING AND DEVELOPING APPARATUS HAVING THE SAME AND SUBSTRATE CLEANING METHOD

(75) Inventors: Atsushi Ookouchi, Koshi (JP); Junji Kume, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 280 days.

(21) Appl. No.: 13/181,832

(22) Filed: Jul. 13, 2011

(65) Prior Publication Data
US 2012/0014689 A1 Jan. 19, 2012

(30) Foreign Application Priority Data
Jul. 14, 2010 (JP) .................................. 2010-160033

(51) Int. Cl.
G03D 5/00 (2006.01)
G03D 15/00 (2006.01)
B08B 1/00 (2006.01)

(52) U.S. Cl.
USPC .......................................... 396/611; 15/97.1

(58) Field of Classification Search
USPC ........................ 396/611; 15/97.1; 134/157
See application file for complete search history.

(56) References Cited

U.S. PATENT DOCUMENTS

| 5,361,449 | A  | * | 11/1994 | Akimoto .......................... 15/302 |
| 5,729,856 | A  | * | 3/1998  | Jang et al. ....................... 15/88.1 |
| 6,334,230 | B1 | * | 1/2002  | Khoury et al. ...................... 15/77 |
| 6,713,401 | B2 | * | 3/2004  | Yokogawa et al. ............. 438/710 |
| 8,127,395 | B2 | * | 3/2012  | Yoon et al. ........................ 15/302 |
| 8,286,293 | B2 | * | 10/2012 | Nishiyama et al. ................. 15/77 |
| 2002/0037680 | A1 | * | 3/2002  | Hayashi et al. .................... 451/5 |
| 2007/0226924 | A1 | * | 10/2007 | Hiraoka et al. ................... 15/102 |
| 2008/0163899 | A1 | * | 7/2008  | Takiguchi et al. ................ 134/30 |
| 2012/0014689 | A1 | * | 1/2012  | Ookouchi et al. ............. 396/611 |

FOREIGN PATENT DOCUMENTS
JP   2008-288447  A   11/2008

* cited by examiner

Primary Examiner — W B Perkey
(74) Attorney, Agent, or Firm — Pearne & Gordon LLP

(57) ABSTRACT

A substrate cleaning apparatus includes a substrate holding and rotating unit for holding a center of a rear surface of a substrate and rotating the substrate; a cleaning unit including a first cleaning member, a second cleaning member provided around the first cleaning member and a base to which the first and second cleaning members are secured; an elevating unit for moving the substrate holding and rotating unit and the cleaning unit relative to each other so as to allow the first and second cleaning members to come into contact with the rear surface of the substrate held by the substrate holding and rotating unit; and a driving unit for driving the substrate and the cleaning unit relative to each other in a direction along the rear surface of the substrate so as to allow part of the second cleaning member to be exposed to the outside of the substrate.

20 Claims, 21 Drawing Sheets

SUBSTRATE CLEANING APPARATUS, COATING AND DEVELOPING APPARATUS HAVING THE SAME AND SUBSTRATE CLEANING METHOD

CROSS-REFERENCE TO RELATED APPLICATION

This application claims the benefit of Japanese Patent Application No. 2010-160033 filed on Jul. 14, 2010, the entire disclosures of which are incorporated herein by reference.

FIELD OF THE INVENTION

The present disclosure relates to a substrate cleaning apparatus configured to clean a substrate such as a semiconductor wafer or a glass substrate for a flat panel display (FPD), a coating and developing apparatus having the substrate cleaning apparatus and a substrate cleaning method.

BACKGROUND OF THE INVENTION

In a manufacturing process of a semiconductor integrated circuit or a FPD, photolithography for forming on a substrate a photoresist pattern to be used as an etching mask is an essential process. In the photolithography process, a photoresist film is formed by coating a photoresist solution on the substrate such as a semiconductor wafer or a substrate for a FPD. Then, the photoresist film is exposed to light by using a patterned photo mask (reticle), and the exposed photoresist film is developed, so that a desired photoresist pattern is obtained. Generally, a photoresist pattern formation system is used for this process and this system includes a coating and developing apparatus for performing coating and developing of the photoresist solution and an exposure apparatus connected to the coating and developing apparatus.

Meanwhile, by way of example, at a periphery of a semiconductor wafer (hereinafter, simply referred to as a "wafer"), there exists a surface inclined from a front surface (and a rear surface) of the wafer toward a side surface thereof. The periphery having this inclined shape is called a beveled portion. The beveled portion prevents the photoresist solution supplied to the surface of the wafer from being coated thicker at the periphery of the wafer than at the other portion thereof. Thus, a photoresist film having a substantially uniform thickness can be formed on the surface of the wafer. If, however, the photoresist solution flows onto the beveled portion, the resist film may be deposited on the beveled portion. Such a resist film remaining on the beveled portion may not be removed by asking performed after an etching process and may become a contamination source.

To solve the problem, it has been suggested to provide a bevel polishing device for polishing the beveled portion in a substrate cleaning unit (see, for example, Patent Document 1). This bevel polishing device may be positioned adjacent to the side of the beveled portion of the wafer held on a spin chuck in the substrate cleaning unit. If a cleaning member of the bevel polishing device comes into contact with the beveled portion of the wafer rotating on the spin chuck, the beveled portion is mechanically cleaned.

Patent Document 1: Japanese Patent Laid-open Publication No. 2008-288447

If the aforementioned bevel polishing device is disposed in the substrate cleaning unit, however, the bevel polishing device may occupy a certain space in the substrate cleaning unit, resulting in an increase of the size of the substrate cleaning unit. For this reason, a footprint of the coating and developing apparatus having the substrate cleaning unit may be increased. Furthermore, since it takes a certain amount of time to operate the bevel polishing device, throughput in the manufacture of the semiconductor integrated circuit or the like may be reduced. Moreover, since manufacturing cost for the bevel polishing device is additionally required, manufacturing costs of the substrate cleaning unit and the coating and developing apparatus including the substrate cleaning unit may rise, which may result in an increase of manufacturing cost of the semiconductor integrated circuit or the like.

BRIEF SUMMARY OF THE INVENTION

In view of the foregoing, the present disclosure provides a space-saving substrate cleaning apparatus capable of cleaning a beveled portion easily and efficiently, a coating and developing apparatus including the substrate cleaning apparatus and a substrate cleaning method.

In accordance with a first aspect of the present disclosure, there is provided a substrate cleaning apparatus including a substrate holding and rotating unit configured to hold a central portion of a rear surface of a substrate and rotate the substrate; a cleaning unit including a first cleaning member, a second cleaning member provided around the first cleaning member and a base to which the first cleaning member and the second cleaning member are secured; an elevating unit configured to move the substrate holding and rotating unit and the cleaning unit relative to each other so as to allow the first cleaning member and the second cleaning member to come into contact with the rear surface of the substrate held by the substrate holding and rotating unit; and a driving unit configured to drive the substrate and the cleaning unit relative to each other in a direction along the rear surface of the substrate so as to allow a part of the second cleaning member to be exposed to the outside of the substrate.

In accordance with a second aspect of the present disclosure, there is provided a coating and developing apparatus including a photoresist film forming unit configured to form a photoresist film on a substrate; the above-mentioned substrate cleaning apparatus configured to clean the substrate on which the photoresist film is formed; and a developing unit configured to develop the photoresist film after the photoresist film is exposed to light.

In accordance with a third aspect of the present disclosure, there is provided a substrate cleaning method including holding a central portion of a rear surface of a substrate and rotating the substrate; allowing a first cleaning member and a second cleaning member provided around the first cleaning member to come into contact with the rear surface of the substrate; and moving the substrate and the first and second cleaning members relative to each other in a direction along the rear surface of the substrate so as to allow a part of the second cleaning member to be exposed to the outside of the substrate.

In accordance with the present disclosure, it is possible to provide a space-saving substrate cleaning apparatus capable of cleaning a beveled portion easily and efficiently, a coating and developing apparatus including the substrate cleaning apparatus and a substrate cleaning method.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
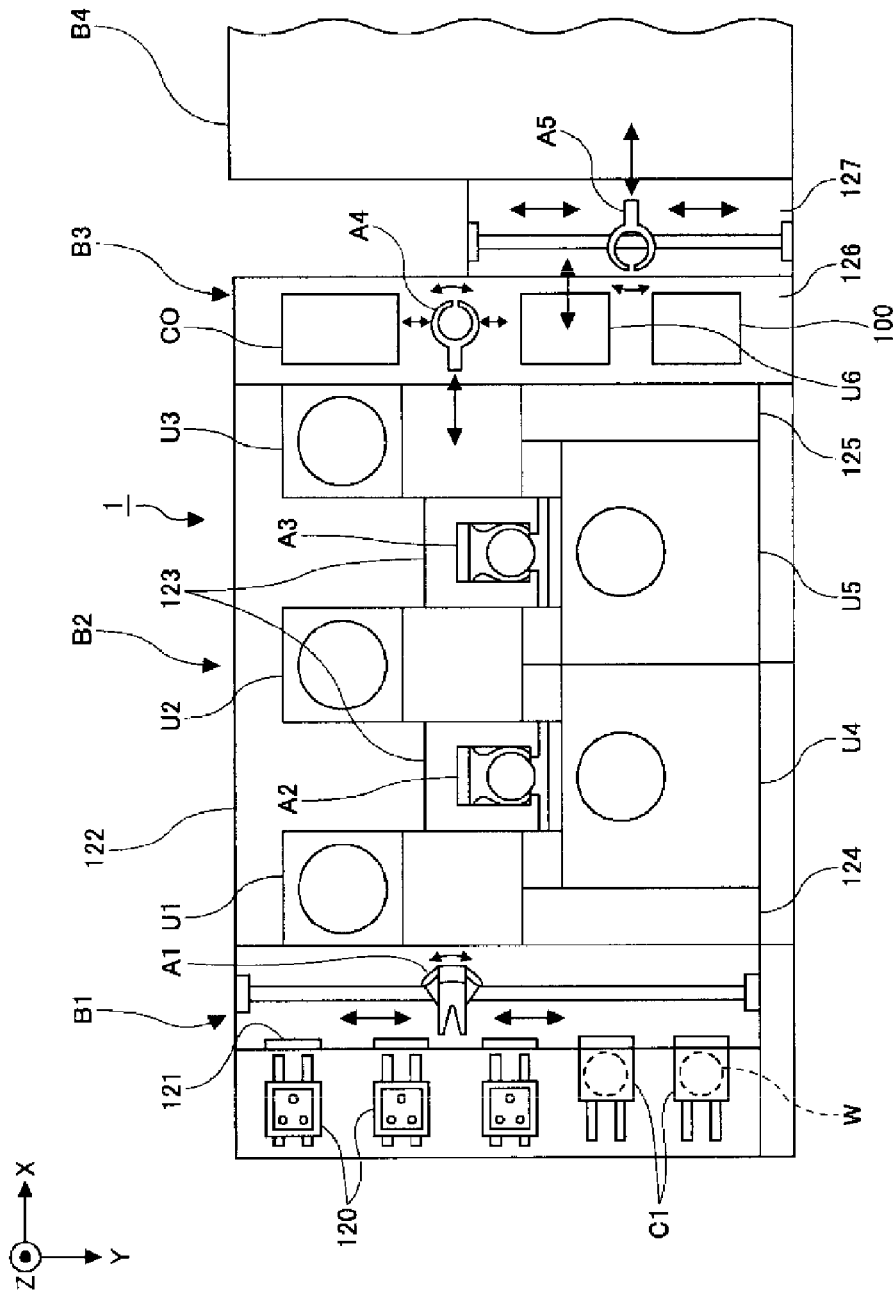
FIG. 1 is a plane view illustrating a coating and developing apparatus in accordance with an embodiment of the present disclosure.

Hereinafter, non-limiting embodiments of the present disclosure will be described with reference to the accompanying drawings. Through the drawings, same or corresponding members or parts will be assigned same or corresponding reference numerals and redundant description thereof will be omitted. Further, a ratio between the sizes of members or parts is not intended to be indicated in the drawings and specific sizes of the member or parts need to be determined by those skilled in the art with reference to the following non-limiting embodiments.

First, a coating and developing apparatus in accordance with an embodiment of the present disclosure will be explained with reference to FIGS. 1 and 2.

Referring to FIG. 1, a coating and developing apparatus 1 in accordance with the embodiment of the present disclosure may include a carrier block B1, a processing block B2 and an interface block B3. Further, an exposure apparatus B4 is connected with the interface block B3 of the coating and developing apparatus 1. The exposure apparatus B4 may be, by way of example, of a liquid immersion type.

Provided in the carrier block B1 are a multiple number of (five, in the shown example) mounting tables 120 for mounting thereon wafer carriers C1 respectively; opening/closing doors 121 provided in a wall at the rear of the mounting tables 120; and a transfer device A1 configured to take out a wafer W from each wafer carrier C1 and return the wafer W back into the wafer carrier C1 through one of the opening/closing doors 121. The transfer device A1 is configured to be movable up and down, rotatable about a vertical axis, movable in an arrangement direction (Y direction) of the wafer carriers C1 and extensible and contractible in a direction (X direction) of the wafer carriers C1 so as to transfer the wafer W between the wafer carriers C1 and a shelf unit U1 of the processing block B2 to be described below.

The processing block B2 is connected to a rear surface (a surface opposite to the wall in which the opening/closing doors 121 are provided) of the carrier block B1. Disposed in the processing block B2 are processing unit sets U4 and U5 including various processing units; shelf units U1, U2 and U3 arranged in the X direction at a preset distance; a transfer device A2 surrounded by the processing unit set U4 and the shelf units U1 and U2; and a transfer device A3 surrounded by the processing unit set U5 and the shelf units U2 and U3.

Figure 2:
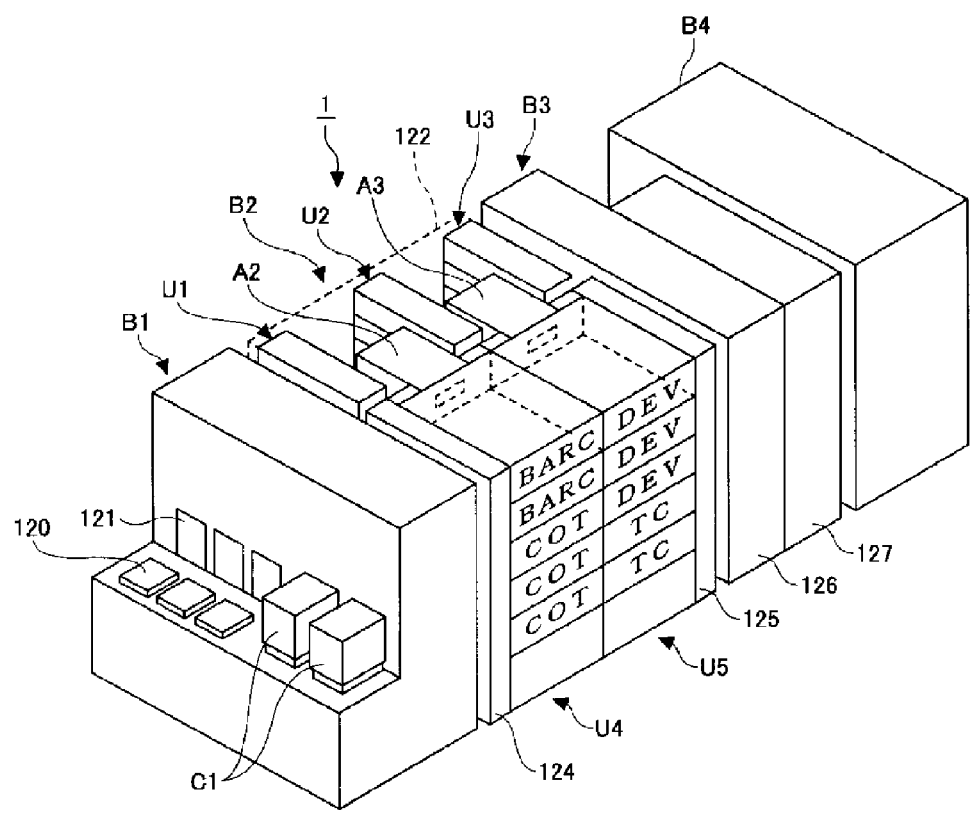
FIG. 2 is a perspective view of the coating and developing apparatus of FIG. 1.

Referring to FIG. 2, in the processing unit set U4, three photoresist coating units COT and two bottom anti-reflection coating units BARC are stacked on top of each other. Further, in the processing unit set U5, two upper anti-reflection coating units TC and three developing units DEV are stacked on top of each other. Each photoresist coating unit COT may include a spin chuck configured to hold and rotate the wafer W thereon; a dispenser configured to drip a photoresist solution on the wafer W held on the spin chuck; and a cup for collecting the photoresist solution dripped from the dispenser and dispersed from a surface of the wafer W due to the rotation of the wafer W by the spin chuck. With this configuration, a photoresist film is formed on the wafer W. Each bottom anti-reflection coating unit BARC and each upper anti-reflection coating unit TC may have the substantially same configuration as that of the photoresist coating unit COT excepting that a liquid chemical for forming an anti-reflection coating is dripped on the wafer W instead of the photoresist solution. With this configuration, the anti-reflection coating is formed on the wafer W. The anti-reflection coating may include a bottom anti-reflection coating formed as a base layer of the photoresist film and an upper anti-reflection coating formed on the photoresist film. Each developing unit DEV may also have the substantially same configuration as that of the photoresist coating unit COT excepting that a developing solution is dripped on the wafer W instead of the photoresist solution. With this configuration, an exposed photoresist film is developed and, thus, a patterned photoresist mask is obtained.

Further, units for performing pre-treatments or post-treatments for the processes performed in the processing unit sets U4 and U5 are stacked in the shelf units U1 to U3 (FIG. 1). These units in the shelf units U1 to U3 may include a hydrophobicizing unit for hydrophobicizing the wafer W, a heating unit for heating (baking) the wafer W, a cooling unit for cooling the wafer W, and so forth.

Referring back to FIG. 1, the interface block B3 may include a first transfer chamber 126 and a second transfer chamber 127. The first transfer chamber 126 and the second transfer chamber 127 are arranged in a direction (X direction) from the processing block B2 toward the exposure apparatus B4 in sequence. A transfer arm A4 is provided in the first transfer chamber 126 and a transfer arm A5 is provided in the second transfer chamber 127. The transfer arms A4 and A5 are movable up and down, rotatable about the vertical axis and extensible and contractible in the X direction. Further, the transfer arm A5 is also movable in the Y direction.

Also disposed in the first transfer chamber 126 are a shelf unit U6, a buffer cassette CO and a substrate cleaning apparatus 100 (described later). The shelf unit U6 may include a heating unit, a temperature control unit, a transfer unit, and the like. The transfer arm A5 loads and unloads the wafer W into and from the substrate cleaning apparatus 100.

Figure 3:
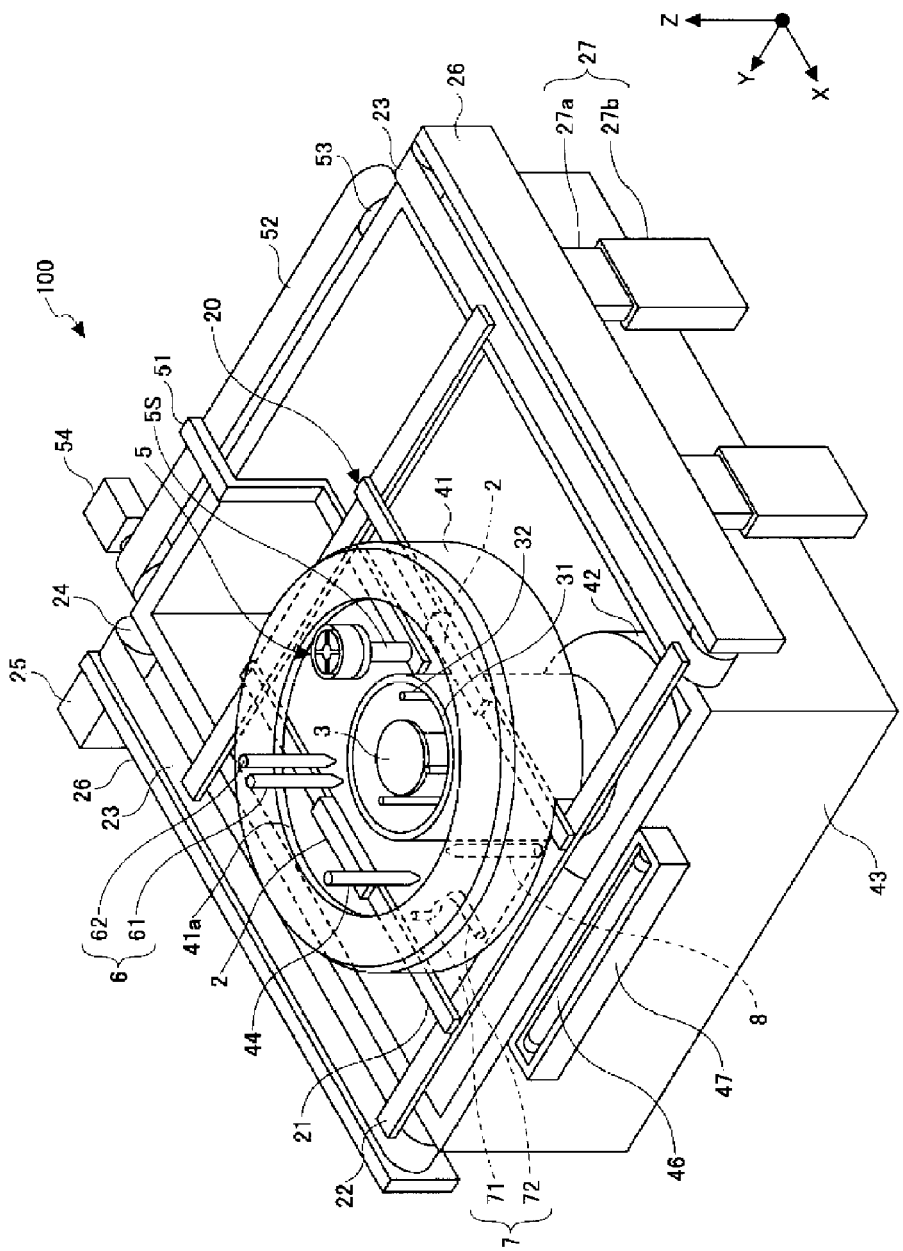
FIG. 3 is a perspective view illustrating a substrate cleaning apparatus provided in the coating and developing apparatus of FIG. 1 in accordance with the embodiment of the present disclosure.

Now, referring to FIGS. 3 to 7C, the substrate cleaning apparatus 100 provided in the interface block B3 will be explained. As depicted in FIG. 3, the substrate cleaning apparatus 100 may include a box-shaped under cup 43 having a top opening; two attraction pads 2 serving as a first substrate holder configured to receive and hold the wafer W from the transfer arm A5 (FIG. 1) of the interface block B3; a spin chuck 3 serving as a second substrate holder configured to receive the wafer W from the attraction pads 2 and attract and hold the wafer W horizontally; and a cleaning head 5 configured to clean a rear surface and a beveled portion of the wafer W.

Figure 4:
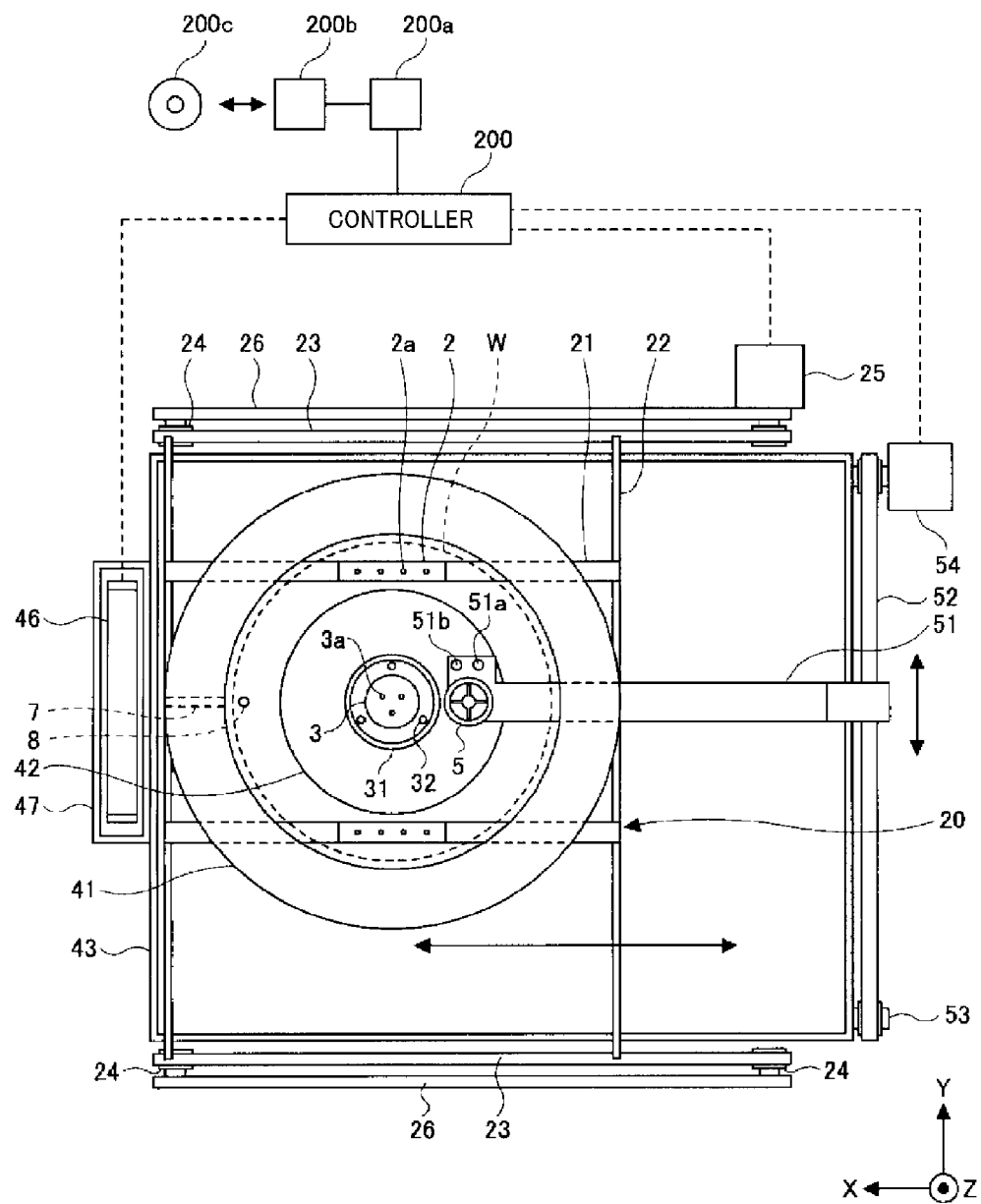
FIG. 4 is a top view of the substrate cleaning apparatus of FIG. 3.

As illustrated in FIG. 4, the two attraction pads 2 are arranged apart from and in parallel to each other so as to hold thereon a periphery of the rear surface of the wafer W. Each of the attraction pads 2 is provided with attraction holes 2a, and the attraction holes 2a communicate with an attraction pipe and a vacuum exhaust unit (not illustrated). With this configuration, the attraction pads 2 are capable of serving as vacuum chucks for holding the wafer W by vacuum attraction. Furthermore, as shown in FIG. 4, each attraction pad 2 is fastened to a substantially central portion of corresponding one of pad supports 21. Each pad support 21 has a long and thin rod shape, and two opposite ends of each pad support 21 are secured to two bridge members 22 respectively. The bridge members 22 form a lattice-shaped member 20.

Ends of the two bridge members 22 in +Y direction are fastened to a belt 23 wound around a pair of pulleys 24, and ends of the bridge members 22 in −Y direction are fastened to a belt 23 wound around another pair of pulleys 24. These two pairs of pulleys 24 are rotatably mounted to side plates 26 that are provided so as to face sidewalls of the under cup 43. A driving unit 25 is connected to one of the pulleys 24. With this configuration, if the pulleys 24 are rotated in one direction by the driving unit 25, the belts 23 may be moved in that direction by the pulleys 24, and if the pulleys 24 are rotated in the opposite direction, the belts 23 may be moved in that opposite direction by the pulleys 24. As a result, the bridge members 22 and, besides, the lattice-shaped member 20 can be moved back and forth in the X direction. Accordingly, the pad supports 21 fastened to the bride members 22, the attraction pads 2 fastened to the pad supports 21 and the wafer W held on the attraction pads 2 can also be moved back and forth in the X direction.

Further, as depicted in FIG. 3, a bottom surface of each of the side plates 26 is supported by a pair of elevating units 27. Each elevating unit 27 may include a slider 27a and a guide 27b. The elevating unit 27 may be fastened to a bottom surface of a housing (not shown) of the substrate cleaning apparatus 100. In order to move the slider 27a up and down along the guide 27b, a driving unit (not shown) may be connected to one of the elevating units 27, and the lattice-shaped member 20 can be moved in a Z direction (vertical direction) of FIG. 3 by this driving unit. Accordingly, the pad supports 21 fastened to the bride members 22, the attraction pads 2 fastened to the pad supports 21 and the wafer W held on the attraction pads 2 can also be moved in the Z direction.

Further, a substantially annular upper cup 41 is provided on the lattice-shaped member 20. The upper cup 41 is provided in order to prevent dispersion of mist or droplets of a cleaning solution. The upper cup 41 may have an opening larger than a diameter of the wafer W, and the wafer W is transferred between the transfer arm A5 and the attraction pads 2 through this opening. The upper cup 41 provided on the lattice-shaped member 20 can be moved in the X direction and in the Z direction along with the lattice-shaped member 20, as illustrated in FIG. 3.

Figure 5:
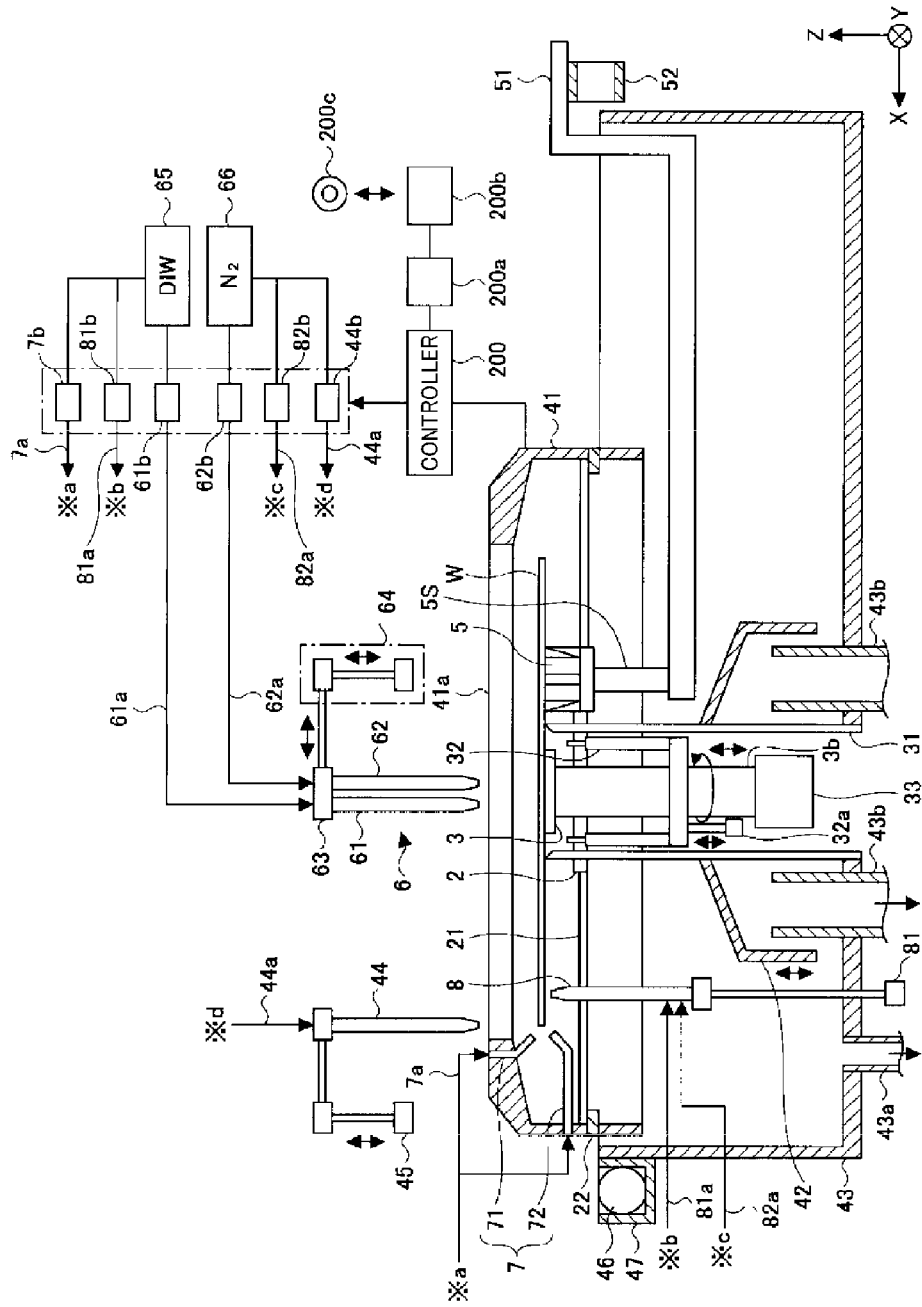
FIG. 5 is a side view of the substrate cleaning apparatus of FIG. 3.

Now, the spin chuck 3 serving as the second substrate holder will be explained. The spin chuck 3 may have a circular disk shape and it supports a central portion of the rear surface of the wafer W. The spin chuck 3 may be positioned between the two attraction pads 2 arranged in parallel to each other. With this arrangement, the central portion of the rear surface of the wafer W held by the spin chuck 3 may not be overlapped with the periphery of the rear surface of the wafer W held by the attraction pads 2. As depicted in FIG. 5, the spin chuck 3 is connected with a driving unit (spin chuck motor) 33 via a shaft 3b and the spin chuck 3 is rotatable about a vertical axis and movable up and down by the driving unit 33. With this configuration, the wafer W held on the spin chuck 3 can be moved up and down with respect to the cleaning head 5 and by adjusting a vertical position of the spin chuck 3, a pressure applied to the rear surface of the wafer W from the cleaning head 5 can be adjusted.

Furthermore, the spin chuck 3 may also be connected with an attraction pipe (not shown), the same as the attraction pads 2 are connected with an attraction pipe (not shown). Accordingly, the spin chuck 3 may function as a vacuum chuck that holds the wafer W by suction through the attraction holes 3a (FIG. 4). Further, supporting pins 32 are provided so as to surround the spin chuck 3. The supporting pins 32 is connected with an elevating unit 32a (FIG. 5) and, thus, the supporting pins 32 move the wafer W up and down while supporting the rear surface of the wafer W. The supporting pins 32 and the external transfer device (transfer arm A5) outside the substrate cleaning apparatus 100 may cooperate to transfer the wafer W from the transfer device to the attraction pads 2 and from the attraction pads 2 to the spin chuck 3, or vice versa.

Figure 6:
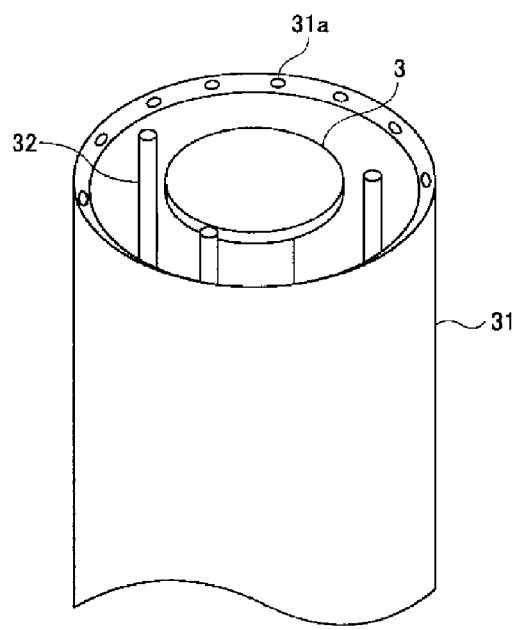
FIG. 6 is an explanatory diagram for describing a drying unit (air knife) of the substrate cleaning apparatus of FIG. 3.

Referring to FIGS. 3 to 5, a cylindrical air knife 31 may be provided so as to surround the spin chuck 3 and the supporting pins 32. By way of example, as depicted in FIG. 6, the air knife 31 may be composed of double cylinders, and a top surface of the double cylinders is hermetically sealed. A multiple number of injection openings 31a are provided in the top surface of the air knife 31 at a regular distance along the circumference thereof. The air knife 31 may jet a gas (e.g., a nitrogen ($N_2$) gas or clean air) from the injection openings 31a through a hollow region between the double cylinders from a non-illustrated supply source. That is, the air knife 31 may serve as a drying device that dries a front surface of the spin chuck 3 and the central portion of the rear surface of the wafer W brought into contact with the spin chuck 3.

Figure 7A:
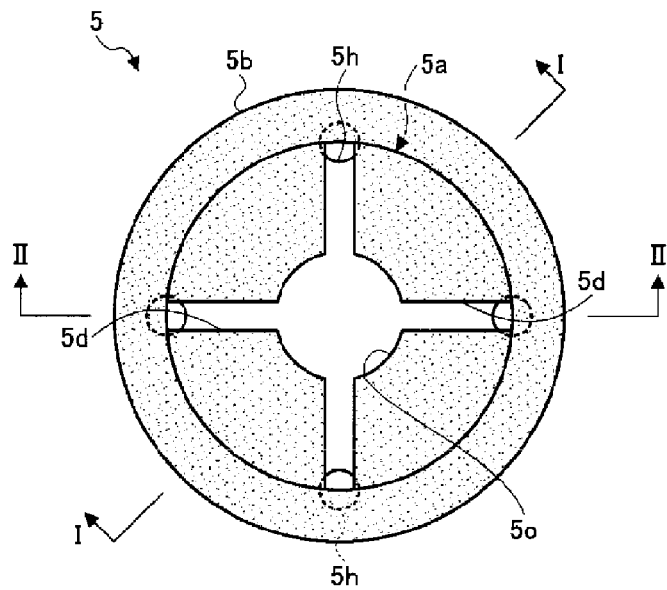
FIGS. 7A to 7C are explanatory diagrams for describing a cleaning head of the substrate cleaning apparatus of FIG. 3.
Figure 7B:
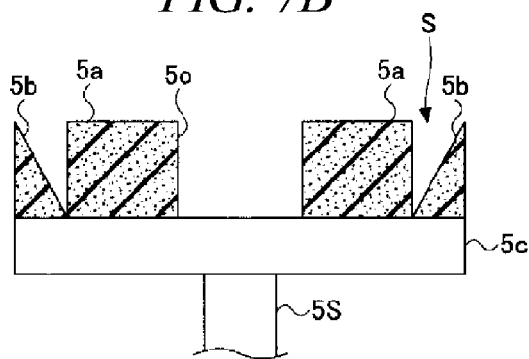
Figure 7C:
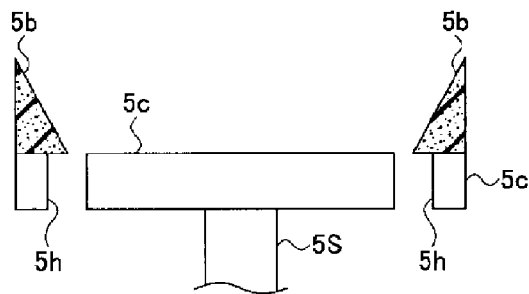

Now, referring to FIGS. 7A to 7C, the cleaning head 5 as a cleaning member for cleaning the rear surface and the beveled portion of the wafer W will be explained. FIG. 7A is a top view of the cleaning head 5; FIG. 7B is a cross sectional view taken along a line I-I of FIG. 7A; and FIG. 7C is a cross sectional view taken along a line II-II of FIG. 7A. As depicted in the drawings, the cleaning head 5 may include a central member 5a having a substantially cylindrical exterior shape and provided at a substantially central portion of the cleaning head 5; a circular ring-shaped member 5b having a substantially circular ring-shaped exterior shape and provided around the central member 5a; and a base 5c on which the central member 5a and the circular ring-shaped member 5b are mounted. An outer diameter of the central member 5a may be in the range of, e.g., about 55 mm to about 75 m, and an outer diameter of the circular ring-shaped member 5b may be in the range of about 65 mm to about 85 mm. Further, heights of the central member 5a and the circular ring-shaped member 5b may be same in the shown example, e.g., about 3 mm to about 7 mm.

In accordance with the present embodiment, the central member 5a and the circular ring-shaped member 5b may be made of, e.g., polyvinyl alcohol (PVA) sponge. Thus, the central member 5a and the circular ring-shaped member 5b may be flexible. Thus, when the central member 5a and the circular ring-shaped member 5b are pressed by a support 51 (to be described later) connected to the base 5c against the rear surface of the wafer W held by the spin chuck 3, they may contract and come into contact with the rear surface of the wafer W at an appropriate pressure. Further, as illustrated in FIGS. 7B and 7C, the circular ring-shaped member 5b may have a substantially triangular cross section. In other words, an inner peripheral surface of the circular ring-shaped member 5b in contact with a side surface of the central member 5a is inclined, and, thus an upwardly enlarging space S is formed between the central member 5a and the circular ring-shaped member 5b. Further, an outer peripheral surface of the circular ring-shaped member 5b stands upright from the base 5c. Moreover, in the shown example, although a lower end of the inner peripheral surface of the circular ring-shaped member 5b is shown to be in contact with the side surface of the central member 5a, they may be spaced apart from each other in other embodiments.

Further, provided at the central member 5a are an opening 5o located at a center of the central member 5a and having a circular shape when viewed from the top; and four cutoff portions 5d extended radially outward from an inner peripheral surface of the central member 5a formed by the opening 5o. By the cutoff portions 5d, corners (edges) are formed at an upper end of the central member 5a. Thus, when the central member 5a comes into contact with (or is pressed against) the rear surface of the wafer W and rotated, a cleaning effect may be improved.

Further, as shown in FIGS. 7A to 7C, the base 5c may be provided with through holes 5h at positions corresponding to the cutoff portions 5d near a boundary between the central member 5a and the circular ring-shaped member 5b. By way of example, when the beveled portion of the wafer W is cleaned, the cleaning solution (e.g., deionized water (DIW) or pure water) supplied to the rear surface of the wafer W can be discharged to a space under the base 5c from the space between the central member 5a and the circular ring-shaped member 5b through the through holes 5h.

Further, referring to FIGS. 3 to 5, the base 5c is fastened to a supporting shaft 5S provided at a leading end of the support 51. The support 51 may have a shape not to interfere with the movement of the wafer W or the bridge members 22. Further, spindles (or pulleys) 53 are rotatably provided at one of sidewalls of the under cup 43 extended in the Y direction, and a belt 52 is wound around the spindles 53. A base end of the aforementioned support 51 is fastened to the belt 52. One of the spindles 53 is connected with a driving unit 54 (FIGS. 3 and 4) and, thus, the spindles 53 are rotated in clockwise or counter clockwise direction, thus moving the belt 52 back and forth. In this way, the support 51 and, besides, the cleaning head 5 can be moved back and forth in the Y direction.

Further, the supporting shaft 5S at the leading end of the support 51 may be configured to be rotated by a non-illustrated rotating unit and thus is capable of rotating the cleaning head 5. With this configuration, the cleaning head 5 can be rotated when it comes into contact with or is pressed against the rear surface of the wafer W, so that removal of particles adhering to the rear surface of the wafer W can be facilitated. Furthermore, as depicted in FIG. 4, a cleaning solution nozzle 51a and a blow nozzle 51b are provided at the leading end of the support 51. The cleaning solution nozzle 51a may supply a cleaning solution (e.g., DIW or pure water) in order to wash away the particles removed from the rear surface of the wafer W by the cleaning head 5, and the blow nozzle 51b may jet a gas such as a $N_2$ gas or clean air in order to facilitate drying of the cleaning solution remaining on the rear surface of the wafer W after cleaning is finished.

Referring to FIGS. 3 and 5, the substrate cleaning apparatus 100 may have a surface cleaning nozzle 6 for cleaning a front surface of the wafer W held on the spin chuck 3. The surface cleaning nozzle 6 may include a cleaning solution nozzle 61 configured to discharge a cleaning solution (e.g., DIW or pure water) to the front surface of the wafer W in order to wash away particles adhering to the front surface of the wafer W; and a gas nozzle 62 configured to supply a gas (e.g., a $N_2$ gas or clean air) in order to dry the cleaning solution remaining on the front surface of the wafer W. As illustrated in FIG. 5, the cleaning solution nozzle 61 and the gas nozzle 62 are supported by a supporting member 63 and are configured to be movable radially and vertically by a driving unit 64. The cleaning solution nozzle 61 and the gas nozzle 62 are positioned to be located above the wafer W being transferred so as not to interfere with the wafer W and the transfer device.

As shown in FIG. 5, provided in bottom portions of the under cup 43 are a drain pipe 43a for draining the cleaning solution collected within the under cup 43 and two exhaust pipes 43b for exhausting a gas current within the substrate cleaning apparatus 100. The exhaust pipes 43b are protruded upward from the bottom of the under cup 43 in order to prevent the cleaning solution collected in the bottom of the under cup 43 from entering the exhaust pipes 43b. Furthermore, in order to prevent the cleaning solution from flowing down and dropping into the exhaust pipes 43b, a ring-shaped inner cup 42 is provided around the air knife 31 to be located above the exhaust pipes 43b.

Further, a blow nozzle 44 is provided above the upper cup 41. The blow nozzle 44 may inject a gas (e.g., a $N_2$ gas or cleaning air) to a periphery of the front surface of the wafer W from above. Further, the blow nozzle 44 is movable up and down by an elevating unit 45. When the wafer W is loaded into or unloaded from the substrate cleaning apparatus 100, the blow nozzle 44 may be moved upward so as not to come into contact with the wafer W or the transfer arm A5 (FIG. 3).

Furthermore, as shown in FIGS. 3 and 5, a lamp box 47 for accommodating therein a UV lamp 46 is provided at a sidewall of the under cup 43 where no belt is provided. The wafer W is loaded into or unloaded from the substrate cleaning apparatus 100 through a space above the UV lamp 46. Accordingly, the UV lamp 46 can irradiate ultraviolet light to the rear surface of the wafer W while the wafer W is being unloaded from the substrate cleaning apparatus 100. In case that polymer particles remain on the rear surface of the wafer W, such particles may be contracted and removed by the ultraviolet light.

Now, referring to FIG. 5, a cleaning solution supply source and a nitrogen gas supply source will be explained. The cleaning solution nozzle 61 of the surface cleaning nozzle 6 is connected with a cleaning solution source 65 via a supply line 61a having a flow rate control unit 61b, and the gas nozzle 62 is connected with a nitrogen gas source 66 via a supply line 62a having a flow rate control unit 62b. Further, the blow nozzle 44 is also connected with the nitrogen gas source 66 via a supply line 44a having a flow rate control unit 44b. Each of the flow rate control units 61b, 62b and 44b may include a valve and a flow rate controller (not shown). The flow rate control units 61b, 62b and 44b control flow rates by starting or stopping the supply of the cleaning solution and the nitrogen gas under the control of a controller 200 (to be described below).

Referring back to FIGS. 4 and 5, the substrate cleaning apparatus 100 includes the controller 200. The controller 200 controls the overall operation of the substrate cleaning apparatus 100. By way of example, the controller 200 may be a computer connected with a storage unit 200a. Stored in the storage unit 200a are computer programs including step (command) sets for implementing a preset operation of each component or element of the substrate cleaning apparatus 100. When necessary, the controller 200 may read out the computer programs from the storage unit 200a and control an operation of each component or element based on these programs. To be specific, the controller 200 may control the transfer devices A1, A2 and A3, the transfer arms A4 and A5, the attraction pads 2 and the spin chuck 3 and output commands to each component or element in order to transfer the wafer W between the transfer arm A5, the attraction pads 2 and the spin chuck 3 and clean the wafer W by the cleaning head 5 and the surface cleaning nozzle 6.

The computer programs may be stored in a storage medium 200c such as a hard disk, a CD-ROM/RAM, a magneto-optical disk, various memory cards or a USB memory and may be stored in the storage unit 200a through an input/output device 200b.

Here, processes for the wafer W in the coating and developing apparatus 1 and the exposure apparatus B4 will be explained.

First, if the wafer carrier C1 accommodating therein wafers W is mounted on the mounting table 120 of the carrier block B1, the opening/closing door 121 and a lid of the wafer carrier C1 are opened. Then, one of the wafers W is taken out of the wafer carrier C1 by the transfer device A1. Thereafter, the wafer W is transferred to the transfer device A2 through a transfer unit of the shelf unit U1. Then, the wafer W is transferred into the hydrophobicizing unit of the shelf unit U1 and a hydrophobicizing process is performed on the wafer W. Thereafter, the wafer W is transferred into the bottom anti-reflection coating unit BARC of the processing unit set U4 and a bottom anti-reflection coating is formed on the wafer W. Thereafter, the wafer W is baked in the heating unit.

Subsequently, the wafer W is transferred into the photoresist coating unit COT, where a photoresist film is formed on a front surface of the wafer W. Thereafter, a heat treatment is performed on the wafer W in the heating unit and then is transferred into the interface block B3 by the transfer device A3 via a transfer unit of the shelf unit U3. In the interface block B3, the wafer W is transferred from the transfer arm A4 to the transfer arm A5 via the transfer unit of the shelf unit U6 and then is transferred into the substrate cleaning apparatus 100 by the transfer arm A5.

Now, an operation of the substrate cleaning apparatus 100 (wafer cleaning method) will be described.

Figure 8A:
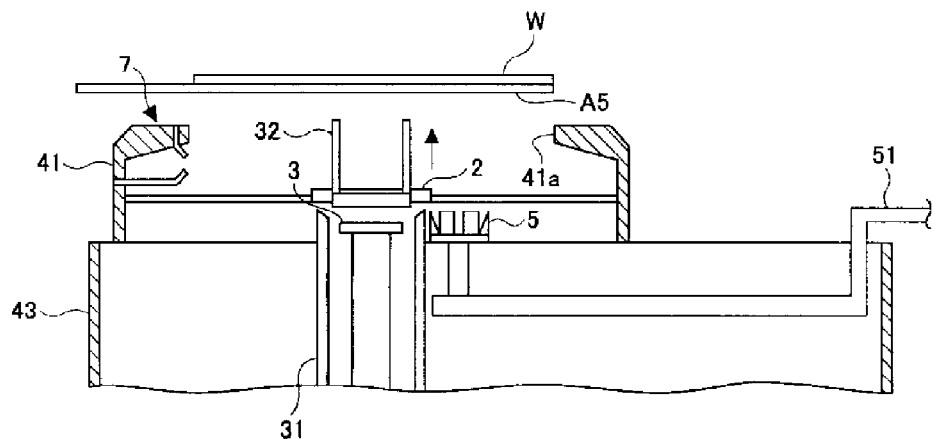
FIGS. 8A to 8C are explanatory diagrams for describing a substrate cleaning method in accordance with an embodiment of the present disclosure.
Figure 8B:
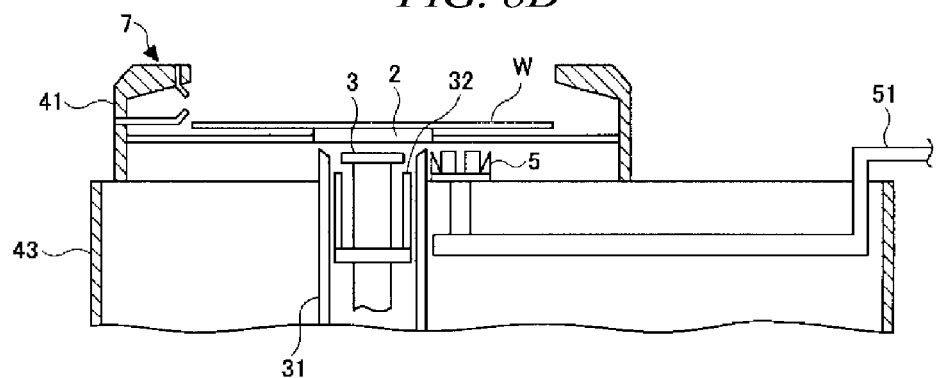

First, as shown in FIG. 8A, the transfer arm A5, which has an arm (wafer supporting portion) having a U shape (or C shape) (see FIG. 1) when viewed from the top, loads the wafer W to be processed into the substrate cleaning apparatus 100 and holds the wafer W above the opening 41a of the upper cup 41. Then, the supporting pins 32 are raised from below the spin chuck 3 and stay at a position under the transfer arm A5. Subsequently, the transfer arm A5 is lowered and transfers the wafer W onto the supporting pins 32. Then, the transfer arm A5 is retreated from the substrate cleaning apparatus 100. At this time, top surfaces of the attraction pads 2 are positioned to be lower than the wafer W supported by the supporting pins 32 and higher than an upper end of the cleaning head 5. Further, a top surface of the spin chuck 3 is positioned lower than the upper end of the cleaning head 5. Thereafter, the supporting pins 32 are lowered, and the wafer W is mounted on the attraction pads 2, as illustrated in FIG. 8B.

Figure 8C:
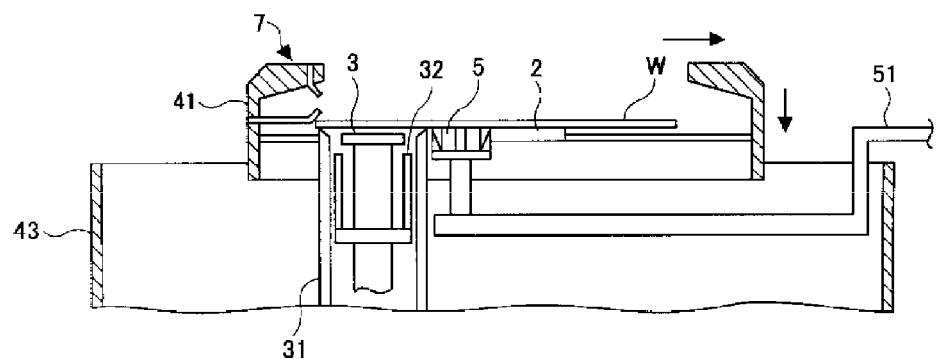

The attraction pads 2 hold thereon the wafer W by vacuum attraction lest the wafer W be lifted even when the cleaning head 5 is pressed against the rear surface of the wafer W. While the wafer W is held on the attraction pads 2 at a position higher than the spin chuck 3, the cleaning head 5 and an upper end of the air knife 31, the upper cup 41, the attraction pads 2 and the wafer W are moved to the right along with the lattice-shaped member 20 (FIG. 4) and the like. After the wafer W is transferred to a predetermined position (e.g., a position where a left end of the air knife 31 and a left end of the wafer W are aligned with each other), the attraction pads 2 are lowered while holding thereon the wafer W, and the rear surface of the wafer W is pressed by the cleaning head 5, as illustrated in FIG. 8C. In this state, the spin chuck 3 is located under the attraction pads 2, and the top surface of the air knife 31 is positioned under the rear surface of the wafer W.

Figure 10:
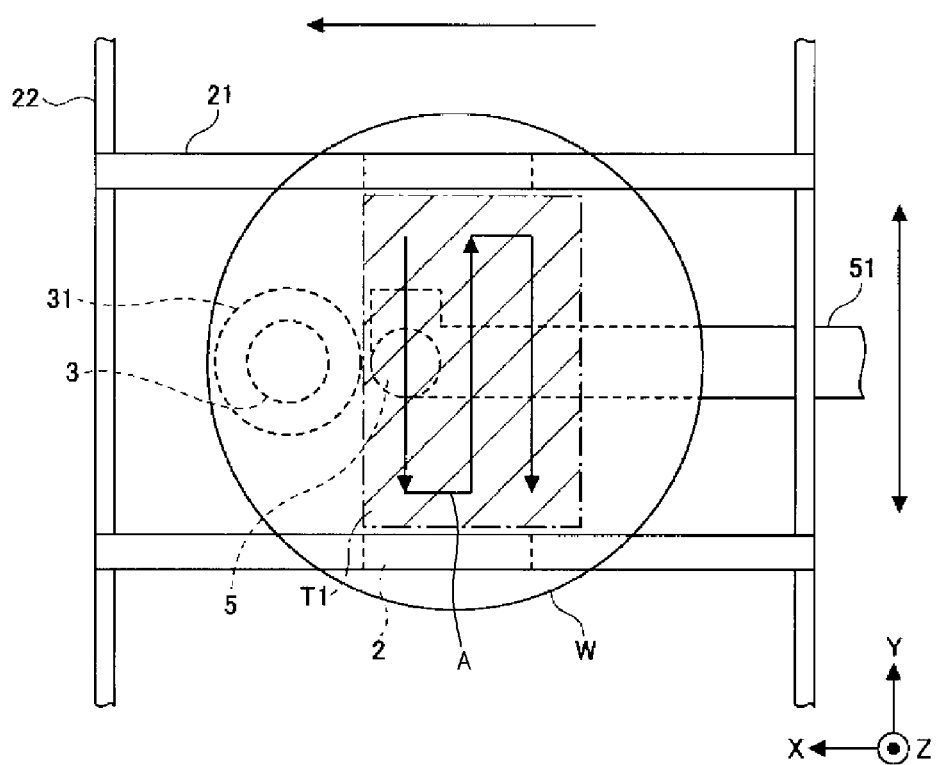
FIG. 10 is an explanatory diagram for describing the substrate cleaning method in accordance with the embodiment of the present disclosure.

Thereafter, after the gas is jetted from the injection openings 31a (FIG. 6) of the air knife 31, the cleaning solution is supplied to the rear surface of the wafer W from the cleaning solution nozzle 51a (FIG. 4) at the leading end of the support 51 and the cleaning head 5 is rotated to thereby clean a central portion of the rear surface of the wafer W. At this time, dispersion of the cleaning solution to the surface of the spin chuck 3 can be prevented by the gas jetted from the injection openings 31a of the air knife 31, so that the surface of the spin chuck 3 can be maintained clean. During the cleaning of the central portion of rear surface of the wafer W, the attraction pads 2 and the cleaning head 5 are moved in cooperation, so that a wide range including the central portion of the rear surface can be cleaned. To elaborate, as illustrated in FIG. 10, for example, the cleaning head 5 is moved back and forth in a Y direction and when the movement direction of the cleaning head 5 is reversed, the attraction pads 2 are shifted in +Y direction by a distance shorter than a diameter of the cleaning head 5. By such a movement, the cleaning head 5 can be moved in zigzags on the rear surface of the wafer W, as illustrated by an arrow A of FIG. 10. As a result, an area T1 (including the central portion of the rear surface of the wafer W) of FIG. 10 can be cleaned completely.

After the area T1 is cleaned, the attraction pads 2 are moved to the left such that a center of the wafer W and a center of the spin chuck 3 are aligned with each other. Then, the wafer W is transferred from the attraction pads 2 to the spin chuck 3 as follows.

Figure 9A:
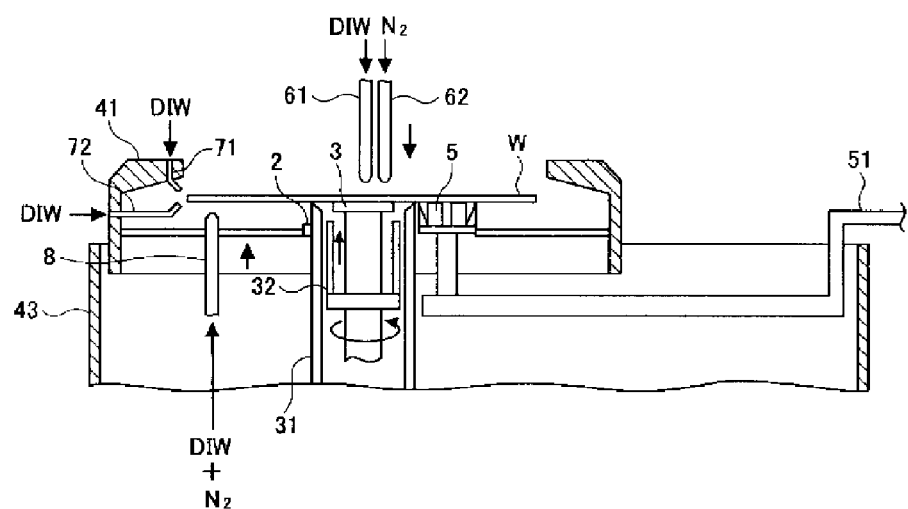
FIGS. 9A and 9B are explanatory diagrams for describing processes of the substrate cleaning method, subsequently to those described in FIGS. 8A to 8C.

First, while the gas is still jetted from the injection openings 31a of the air knife 31, the movement and the rotation of the cleaning head 5 are stopped and the supply of the cleaning solution from the cleaning solution nozzle 51a (FIG. 4) at the leading end of the support 51 is also stopped. Subsequently, after the wafer W is released from the state where it is attracted onto the attraction pads 2, the spin chuck 3 is raised and the central portion of the rear surface of the wafer W is held by the spin chuck 3. The spin chuck 3 holds thereon the wafer W by vacuum attraction so as not to allow the wafer W to be lifted even when the cleaning head 5 is pressed against the rear surface of the wafer W (FIG. 9A). Afterward, the upper cup 41 and the attraction pads 2 are lowered and the wafer W is transferred from the attraction pads 2 to the spin chuck 3.

Figure 9B:
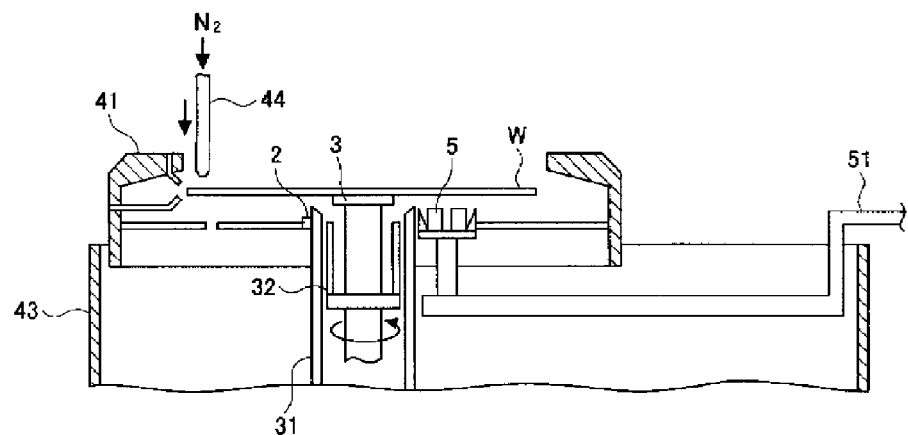

Then, as shown in FIGS. 9A and 9B, while the wafer W is held on the spin chuck 3, the front surface, the rear surface and the beveled portion of the wafer W are cleaned, desirably, at the same time. To elaborate, the wafer W is started to be rotated by the spin chuck 3 and is continuously rotated at a relatively low speed. Further, the surface cleaning nozzle 6 is lowered such that a leading end of the cleaning solution nozzle 61 is located about 10 mm above a central portion of the front surface of the wafer W, and the cleaning solution is supplied from the cleaning solution nozzle 61 to the central portion of the front surface of the wafer W. The cleaning solution supplied to the central portion of the front surface of the wafer W flows on the front surface of the wafer W toward a periphery thereof. If the cleaning solution nozzle 61 is continuously shifted radially outward while the cleaning solution is supplied to the wafer W from the cleaning solution nozzle 61, the gas nozzle 62 may also be shifted along with the cleaning solution nozzle 61 and reach a position above the central portion of the front surface of the wafer W. Accordingly, the central portion of the front surface of the wafer W is dried by the $N_2$ gas from the gas nozzle 62. Then, if the cleaning solution nozzle 61 and the gas nozzle 62 are continuously shifted radially outward while the cleaning solution and the $N_2$ gas are respectively supplied to the wafer W from the cleaning solution nozzle 61 and the gas nozzle 62, the entire front surface of the wafer W can be cleaned by an impact force of the cleaning solution and the flow of the cleaning solution on the front surface of the wafer W. Further, the front surface of the wafer W may be dried by the $N_2$ gas from the gas nozzle 62, starting from its inner area.

Figure 11:
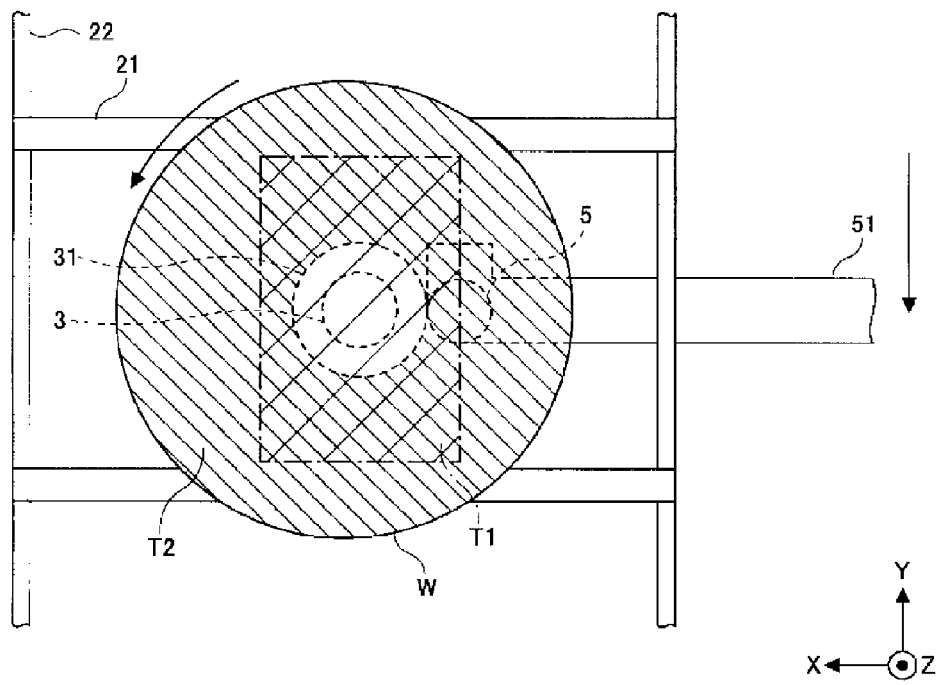
FIG. 11 is an explanatory diagram for describing the substrate cleaning method in accordance with the embodiment of the present disclosure.

While the cleaning and the drying of the front surface of the wafer W are being performed, the cleaning solution is supplied to the rear surface of the wafer W from the cleaning solution nozzle 51a of the support 51 of the cleaning head 5, and the rear surface of the wafer W is cleaned by the cooperation of the spin chick 3 that rotates the wafer W and the cleaning head 5 that is moving radially below the rear surface of the wafer W. To elaborate, after the cleaning head 5 is placed in the vicinity of the air knife 31, the driving unit 33 (FIG. 5) of the spin chuck 3 is lowered, and the rear surface of the wafer W is pressed against the cleaning head 5 at a certain pressure. With the beginning of the rotation of the wafer W, the cleaning solution is supplied toward the rear surface of the wafer W from the cleaning solution nozzle 51a of the support 51 and the cleaning head 5 is also begun to rotate. By way of example, if the wafer W is rotated at about 360°, the support 51 and the cleaning head 5 are shifted in −Y direction (FIG. 11) by a distance the same as or smaller than the diameter of the cleaning head 5. As such movements are repeated, the cleaning head 5 is moved along concentric paths relative to the rear surface of the wafer W and reaches the beveled portion of the wafer W.

Figure 12A:
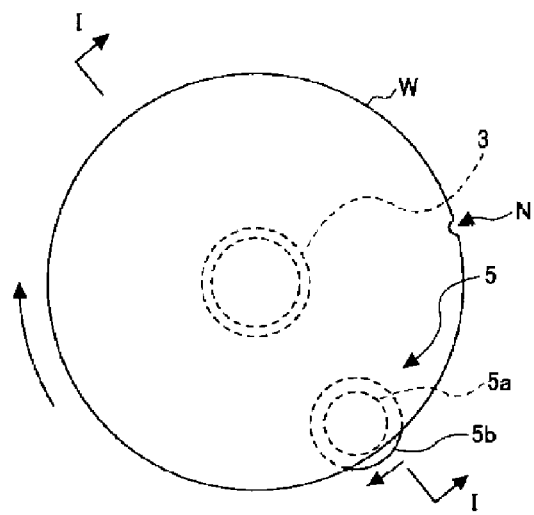
FIG. 12A is a top view schematically illustrating a state in which a beveled portion of a wafer is cleaned by the cleaning head shown in FIGS. 7A to 7C.
Figure 12B:
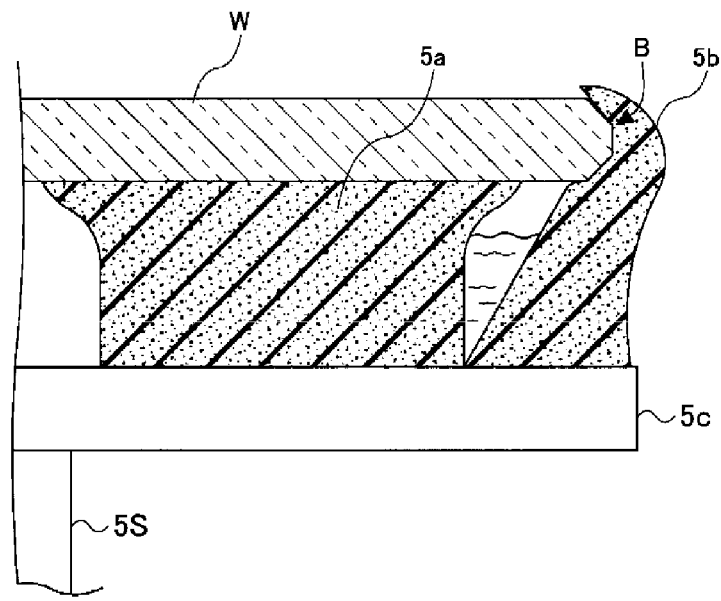
FIGS. 12B and 12C are cross sectional views schematically illustrating states in which the beveled portion of the wafer is cleaned by the cleaning head shown in FIGS. 7A to 7C.
Figure 12C:
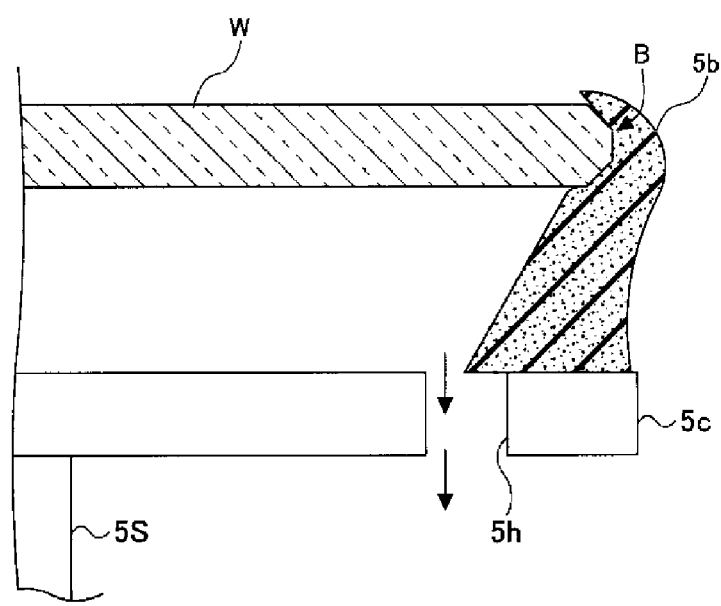

When the cleaning head 5 reaches the beveled portion, the circular ring-shaped member 5b of the cleaning head 5 may be partially exposed (protruded) to the outside of the beveled portion B (FIGS. 12B and 12C) of the wafer W, as illustrated in FIG. 12A. Before reaching the beveled portion, both the central member 5a and the circular ring-shaped member 5b of the cleaning head 5 may be pressed against the rear surface of the wafer W. However, if the cleaning head 5 reaches the beveled portion B and the circular ring-shaped member 5b protrudes outward, the circular ring-shaped member 5b may not be pressed downward from the above, and the inner peripheral surface of the circular ring-shaped member 5b may come into contact with the beveled portion B, as schematically illustrated in FIG. 12B. Besides, since the circular ring-shaped member 5b is flexible, the beveled portion B may be horizontally pressed against the inclined inner peripheral surface of the circular ring-shaped member 5b at an appropriate pressure. Since the wafer W and the cleaning head 5 are rotated in this state, the entire beveled portion B may be rubbed against the circular ring-shaped member 5b, so that the beveled portion B can be cleaned efficiently. Further, at this time, although the cleaning solution supplied from the cleaning solution nozzle 51a to the rear surface of the wafer W may be collected in the space between the side surface of the central member 5a and the inner peripheral surface of the circular ring-shaped member 5b, as illustrated in FIG. 12B, the collected solution may be discharged through the through holes 5h provided in the base 5c, as indicated by arrows of FIG. 12C.

After the cleaning head 5 arrives at the beveled portion B of the wafer W, if the wafer W is rotated at least one time, the cleaning of the rear surface and the beveled portion B of the wafer W may be terminated. In this way, an area T2, which is marked by slanting lines inclined to the right (i.e., slanting lines ascending from the right to the left) in FIG. 11, can be completely cleaned.

Moreover, since the gas is jetted toward the rear surface of the wafer W from the injection openings 31a of the air knife 31, the cleaning solution (DIW) may be blown outward, so that a rear surface portion of the wafer W facing the air knife 31 can be maintained dry. That is, the air knife 31 prevents the cleaning solution from reaching the spin chuck 3, so that the spin chuck 3 can be maintained dry.

After the front surface, the rear surface and the beveled portion B of the wafer W are cleaned as described above, the surface cleaning nozzle 6 is moved upward; the rotation and the movement of the cleaning head 5 are stopped; the supply of the cleaning solution from the cleaning solution nozzle 51a is stopped; and the rotation of the spin chuck 3 is temporarily stopped. Then, since the rear surface of the wafer W is mainly wet by the cleaning solution, the wafer W is dried by rotating the wafer W by the spin chuck 3 at a high speed. At this time, the blow nozzle 44 retreated upward is moved downward, as illustrated in FIG. 9B and, at the same time, the blow nozzle 51b in the vicinity of the cleaning head 5 is placed below the beveled portion B of the wafer W. Then, the gas is injected toward the beveled portion B from above and below, so that drying of the beveled portion B of the wafer W can be facilitated.

If the cleaning and the drying of the wafer W are completed through the above-described operations, the wafer W is transferred by the transfer arm A5 (FIG. 3) in the reverse order to the order in which the wafer W is loaded into the substrate cleaning apparatus 100. During the transfer of the wafer W, the UV lamp 46 (FIGS. 3 and 4) are turned on and ultraviolet rays are irradiated toward the rear surface of the wafer W held by the transfer arm A5 (FIG. 3) having the U-shaped wafer supporting portion. Although particles remain on the rear surface of the wafer W, organic materials may be decomposed by the ultraviolet rays. By way of example, particles originated from photoresist may be contracted and removed from the rear surface of the wafer W, so that defocusing problem can be avoided.

During the unloading of the wafer W, the attraction pads 2 and the spin chuck 3 may be returned back to their initial positions as illustrated in FIG. 8A, for example, and remain in a standby state till a next wafer W is loaded. If the next wafer W is loaded, the above-described operations are repeated. In this way, a multiple number of wafers W can be processed in sequence.

The wafer W cleaned by the substrate cleaning apparatus 100 as described above is transferred into the exposure apparatus B4 (see FIG. 1) and liquid immersion exposure is performed on the wafer W after a pure water layer, for example, is formed on the front surface of the wafer W. After the completion of the liquid immersion exposure, the wafer W is taken out of the exposure apparatus B4 and transferred into, e.g., the substrate cleaning apparatus 100 of the interface block B3. Then, in the substrate cleaning apparatus 100, pure water remaining on the front surface of the wafer W is removed. Thereafter, the wafer W is transferred into the heating unit of the shelf unit U6 and a post exposure baking (PEB) process is performed on the wafer W.

Subsequently, the wafer W is taken out of the heating unit by the transfer arm A4 and transferred to the transfer device A3. Then, the wafer W is transferred into the developing unit (DEV) by the transfer device A3. After a preset process is performed on the wafer W in the developing unit (DEV), the wafer W is baked in the heating unit and then is returned by the transfer device A1 back into the wafer carrier C1 of the carrier block B1 where it is first accommodated.

Through the above-described operations, the series of processes performed on the wafer W in the coating and developing apparatus 1 and the exposure apparatus B4 are terminated.

In accordance with the substrate cleaning apparatus 100 in accordance with the embodiment of the present disclosure, while the wafer W is being rotated by the spin chuck 3 with the central portion of the rear surface of the wafer W held on the spin chuck 3, the cleaning head 5 is pressed against the rear surface (except the central portion thereof) of the wafer W and is rotated, so that the rear surface of the wafer W is cleaned. When the cleaning head 5 arrives at the beveled portion B of the wafer W by the movement of the support 51 to which the cleaning head 5 is secured, the circular ring-shaped member 5b of the cleaning head 5 partially protrudes to the outside of the wafer W and comes into contact with the beveled portion B. Since the wafer W and the cleaning head 5 are rotated in this state, the beveled portion B may be rubbed against the circular ring-shaped member 5b and cleaned thereby.

As discussed above, the cleaning head 5 can clean not only the rear surface of the wafer W but also the beveled portion B thereof because a part of the circular ring-shaped member 5b of the cleaning head 5 is exposed (protruded) to the outside of the wafer W at the last step of cleaning the rear surface of the wafer W. That is, the beveled portion B can be cleaned simply in a short time, consecutively after cleaning the rear surface of the wafer W. Thus, a further process for cleaning the beveled portion B need not be performed. Accordingly, a great reduction of throughput may not be caused.

Moreover, since the beveled portion can be cleaned by the cleaning head 5 configured to clean the rear surface of the wafer W, an additional component for cleaning the beveled portion need not be provided. Accordingly, increase of the size of the substrate cleaning apparatus 100 can be avoided and neither an additional manufacturing cost nor an additional space is required. Furthermore, an extra space for the substrate cleaning apparatus 100 is not necessary in the coating and developing apparatus 1 including the substrate cleaning apparatus 100, so that space for the coating and developing apparatus 1 can be saved.

Furthermore, during the cleaning of the rear surface of the wafer W, since the cleaning solution is supplied from the cleaning solution nozzle 51a at the leading end of the support 51 to which the cleaning head 5 is secured, the central member 5a and the circular ring-shaped member 5b made of sponge can absorb the cleaning solution, so that the beveled portion B can be efficiently cleaned. If an excessive amount of the cleaning solution is supplied, however, the circular ring-shaped member 5b may not absorb the cleaning solution completely, so that the beveled portion B may be excessively wet. In such a case, the cleaning solution may remain in a notch N (FIG. 12A) formed at an edge of the wafer W. Then, if the cleaning solution is dried, a watermark would be left in the notch N or particles contained in the cleaning solution would be left in the notch N. In the cleaning head 5, however, since the inner peripheral surface of the circular ring-shaped member 5b is inclined such that the space between the inner peripheral surface of the circular ring-shaped member 5b and the side surface of the central member 5a is enlarged upward and since the through holes 5h are formed through the base 5c at positions corresponding to the cutoff portions 5d, the cleaning solution collected in the space between the central member 5a and the circular ring-shaped member 5b may be discharged through the through holes 5h. Accordingly, the circular ring-shaped member 5b is allowed to contain an appropriate amount of cleaning solution and the cleaning solution may not remain in the notch N. Thus, contamination of the notch N can be suppressed.

Besides, in accordance with the present embodiment, since the inner peripheral surface of the circular ring-shaped member 5b of the cleaning head 5 is inclined in the aforementioned manner, the entire beveled portion B especially from a lower portion (a portion inclined from the rear surface of the wafer W toward a side surface thereof) to the side surface of the wafer W can be in contact with the inner peripheral surface of the circular ring-shaped member 5b. Since it is difficult to clean the lower portion of the beveled portion B by, e.g., an asking process, the cleaning head 5 in accordance with the present embodiment capable of efficiently cleaning the lower portion of the beveled portion B is especially advantageous.

Now, referring to FIG. 13, there will be explained experiments for investigating an effect of cleaning the rear surface of the wafer by the aforementioned wafer cleaning method performed by the substrate cleaning apparatus 100.

The experiments are conducted by preparing a test wafer having an intentionally contaminated beveled portion and by cleaning this wafer. To elaborate, a wafer having a silicon nitride film deposited thereon is transferred to a transfer arm (corresponding to the transfer arm A5), and residues of the silicon nitride film have been attached to the U-shaped portion of this transfer arm in contact with the wafer. By transferring a bare wafer by this contaminated transfer arm, a test wafer having the beveled portion contaminated with the residues is prepared. Among the beveled portion of the test wafer, a portion to which the residues adhere (hereinafter, referred to as a "contaminated portion") is observed by eyes or by using an optical microscope. Then, the beveled portion is cleaned by various methods to be described below and an area of the contaminated portion after the cleaning is measured and a removal rate is calculated.

The cleaning method is as follows (the following headings (1) to (5) correspond to a horizontal axis of a graph in FIG. 13).

(1) "Brush in a Comparative Example"

As a cleaning member of a comparative example, a cleaning brush is prepared by fastening a cylindrical sponge to a base. The cleaning brush is mounted on the leading end of the support 51 of the substrate cleaning apparatus 100 instead of the cleaning head 5, and the beveled portion of the test wafer is cleaned by this substrate cleaning apparatus 100.

(2) "Cleaning Nozzle"

A cleaning nozzle the same as a bevel cleaning nozzle 7 to be described later is provided in the substrate cleaning apparatus 100, and the beveled portion of the test wafer is cleaned by discharging a cleaning solution (DIW) toward the beveled portion of the test wafer.

(3) "Combination of the Brush of the Comparative Example and the Cleaning Nozzle"

After the beveled portion of the test wafer is cleaned by the cleaning brush, cleaning by the aforementioned cleaning nozzle is also performed.

(4) "Experimental Example 1"

The beveled portion of the test wafer is cleaned by the substrate cleaning apparatus 100 having the cleaning head 5.

(5) "Experimental Example 2"

A cleaning head 5 (to be described later) using, instead of the PVA sponge, a brush wound with a plastic thread is fastened to the substrate cleaning apparatus 100, and the beveled portion of the test wafer is cleaned by this substrate cleaning apparatus 100.

Figure 13:
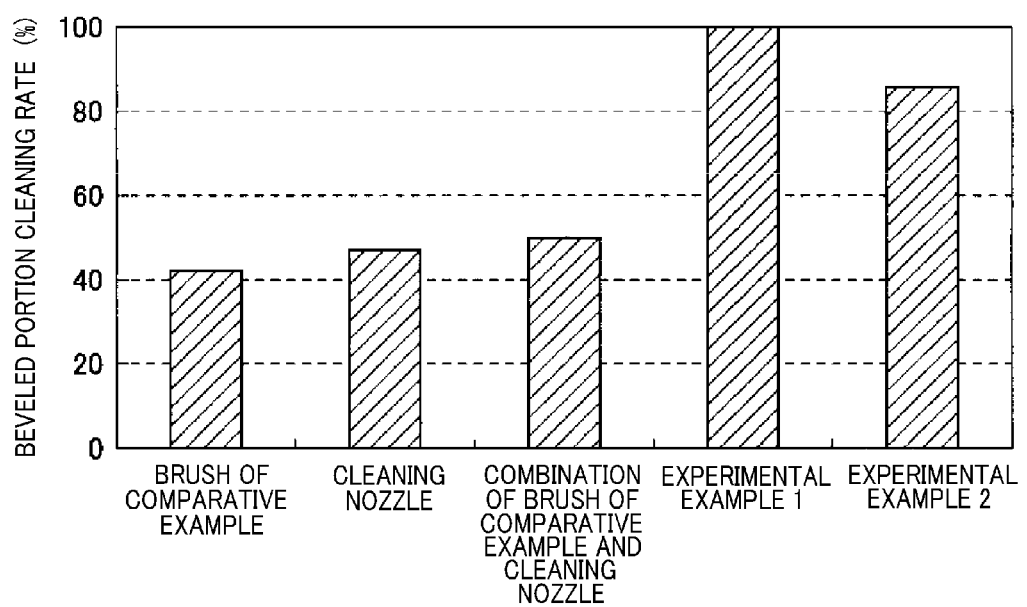
FIG. 13 is a graph showing a result of an experiment conducted to investigate an effect of a substrate cleaning method in accordance with the embodiment of the present disclosure.

Referring to FIG. 13, when using the brush of the comparative example, it is found out that only about 42% of the residues can be eliminated. Such a removal rate is deemed to be resulted because the brush of the comparative example does not have the central member 5a and the circular ring-shaped member 5b and thus the brush does not come into contact with (or is rubbed against) the beveled portion of the test wafer.

When discharging the cleaning solution toward the beveled portion from the cleaning nozzle, about 47% of the residues adhering to the beveled portion is found to be removed, and a higher removal rate is obtained as compared to the case of using the brush of the comparative example. However, the cleaning by an impact force of the cleaning solution is a non-contact type cleaning method, so that the removal rate is not sufficiently high. Furthermore, when combining the brush of the comparative example and the cleaning nozzle, a removal rate increases only to about 50% and no more improvement can be achieved. However, it may be possible to further improve the removal rate by adjusting a pressure for discharging the cleaning solution from the cleaning nozzle.

Meanwhile, when using the cleaning head 5 made of the sponge, the residues adhering to the beveled portion of the test wafer are found to be eliminated almost completely. Furthermore, when using the cleaning head 5 made of the plastic brush, a high removal rate of about 86% is obtained. These results are deemed to be achieved due to the effect of bringing the beveled portion into contact with (or rubbing the beveled portion against) the circular ring-shaped member 5b. From the above experiments, the effect and advantage of the substrate cleaning apparatus in accordance with the present embodiment could be proved.

Further, as for the experiment examples 1 and 2, particles on a front surface of the test wafer are measured before and after the cleaning is performed. As a result, increase of the particles after the cleaning of the beveled portion is not observed.

In the above, although the present disclosure has been described with respect to the embodiments, the present disclosure may not be limited thereto and can be modified in various ways within the meaning and scope of the appended claims.

Figure 14A:
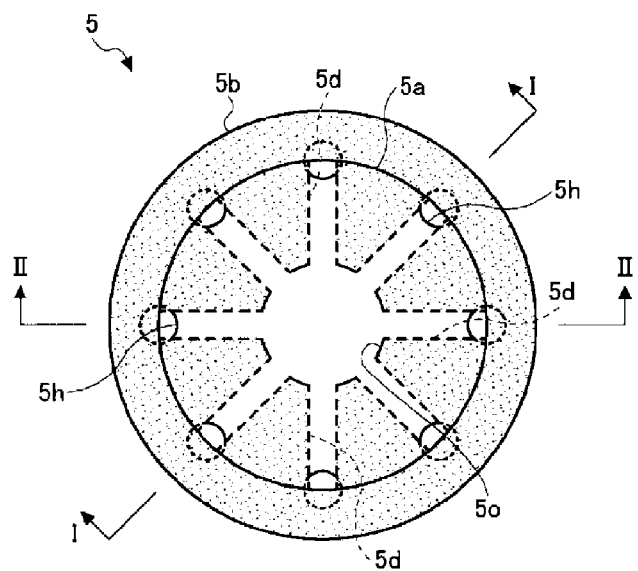
FIGS. 14A to 14C are explanatory diagrams for describing a modification example of the cleaning head in accordance with the embodiment of the present disclosure.
Figure 14B:
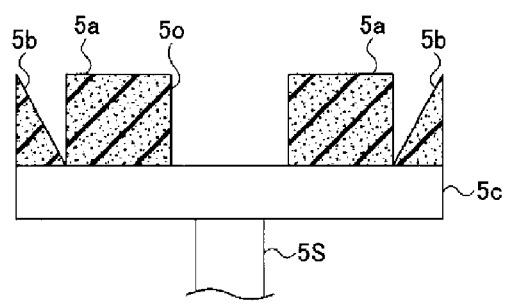
Figure 14C:
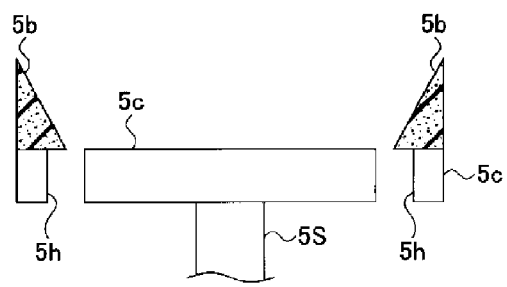

By way of example, the cleaning head 5 may have the following shape. Referring to FIGS. 14A to 14C, the cleaning head 5 may have eight cutoff portions 5d extending radially outward from a central member 5a; and through holes 5h formed in a base 5c so as to correspond to the eight cutoff portions 5d. Except this configuration, the other configurations are the same as those of the cleaning head 5 shown in FIGS. 7A to 7C. With this configuration, the beveled portion B of the wafer W can be still cleaned by a circular ring-shaped member 5b of the cleaning head 5 when the circular ring-shaped member 5b partially reaches an edge of the wafer W. Further, since the number of the cutoff portions 5d is greater than that of the cleaning head 5 of FIGS. 7A to 7C, a higher cleaning effect by the cutoff portions 5d may be expected. Moreover, since the number of the through holes 5h is greater than that of the cleaning head 5 of FIGS. 7A to 7C, the cleaning solution can be more efficiently drained, this configuration is deemed to be very adequate for the case of, by way of example, supplying a comparatively great amount of cleaning solution from a cleaning solution nozzle 51a. Here, the number of the cutoff portions 5d and the number of the through holes 5h may not be limited to four in FIGS. 7A to 7C or eight in FIGS. 14A to 14C but can be modified appropriately.

Figure 15A:
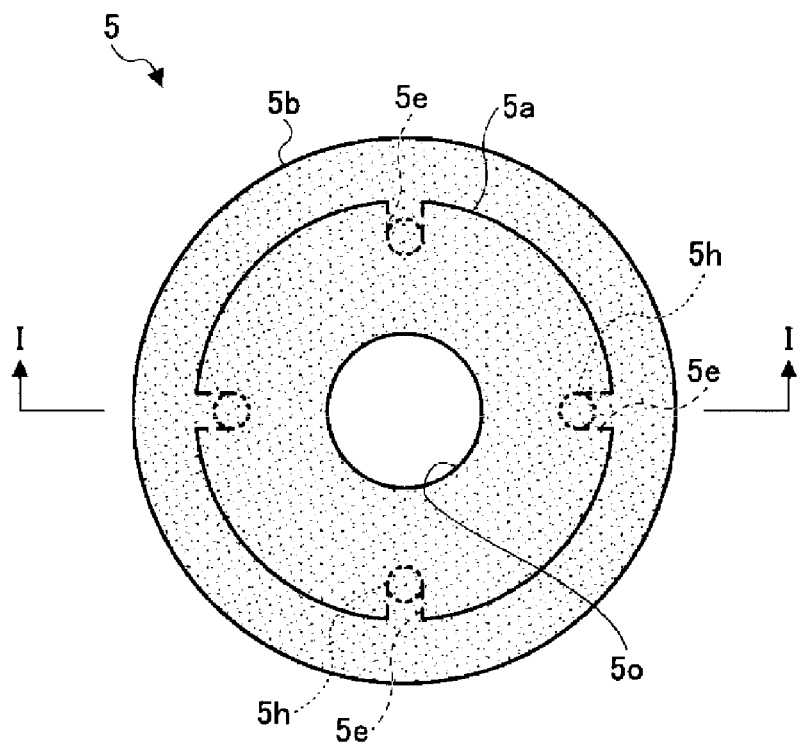
FIGS. 15A and 15B are explanatory diagrams for describing another modification example of the cleaning head in accordance with the embodiment of the present disclosure.
Figure 15B:
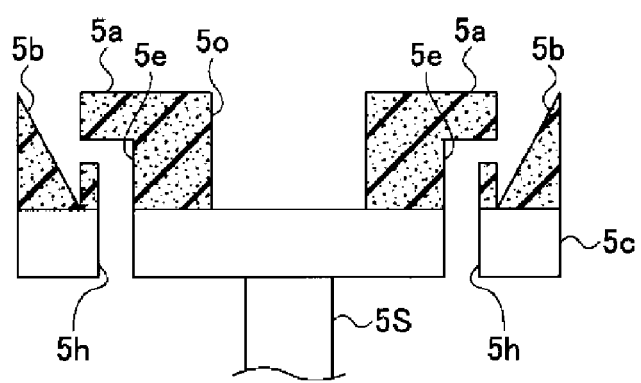

Further, a cleaning head 5 illustrated in FIGS. 15A and 15B may have an opening 5o provided in a substantial center of a central member 5a; and pipes 5e opened at a side surface of the central member 5a and curved toward a base 5c within the central member 5a. Each pipe 5e may have a diameter capable of allowing the pipe 5e not to be broken even when the central member 5a is deformed by being pressed against the rear surface of the wafer W. Further, through holes 5h are provided in the base 5c so as to be connected with the pipes 5e. A circular ring-shaped member 5b of this cleaning head 5 may have the same configuration as that of the circular ring-shaped member 5b illustrated in FIGS. 7A to 7C. With this configuration, the beveled portion B of the wafer W can be still cleaned by the circular ring-shaped member 5b. Further, since the cleaning solution collected between a space between the central member 5a and the circular ring-shaped member 5b can be drained through the pipes 5e and the through holes 5h, the cleaning solution can be prevented from remaining, especially, in a notch (FIG. 12A) of the wafer W. In addition, although four pipes 5e and four through holes 5h are shown in FIGS. 15A and 15B, the number of the pipes 5e and the through holes 5h may be selected appropriately.

Figure 16A:
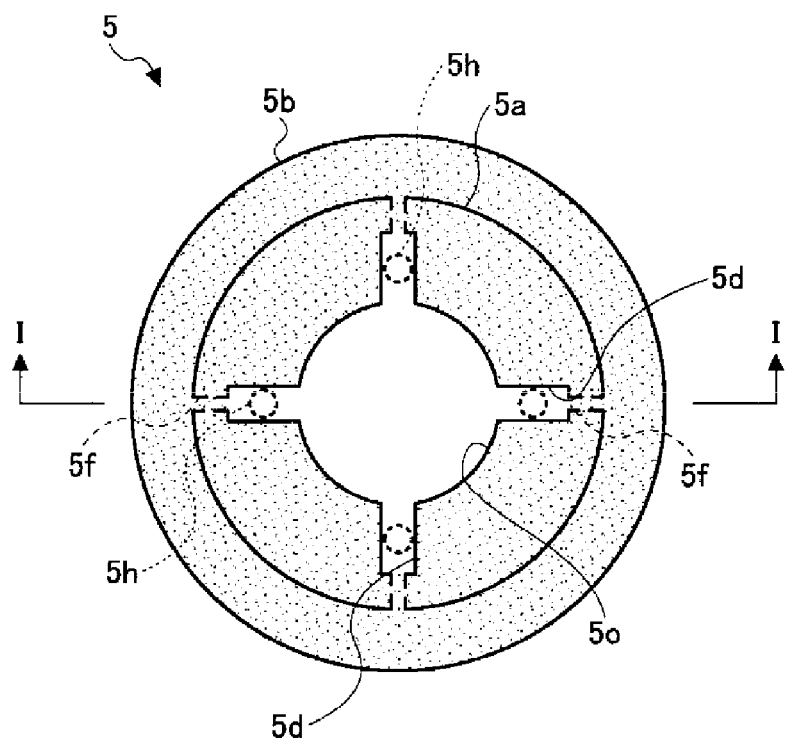
FIGS. 16A and 16B are explanatory diagrams for describing another modification example of the cleaning head in accordance with the embodiment of the present disclosure.
Figure 16B:
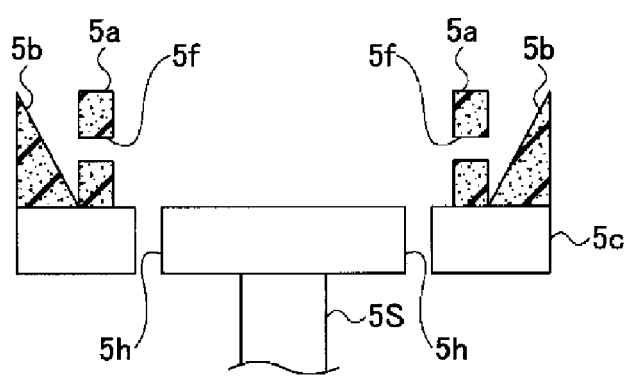

Referring to FIGS. 16A and 16B, a cleaning head 5 may have an opening 5o provided in a substantial center of a central member 5a; four cutoff portions 5d extending radially outward from an inner peripheral surface of the central member 5a formed by the opening 5o; and pipes 5f opened at an outer peripheral surface of the central member 5a and communicating with the cutoff portions 5d. Each pipe 5f may have a diameter capable of allowing the pipe 5f not to be broken even when the central member 5a is deformed by being pressed against the rear surface of the wafer W. Further, through holes 5h of a base 5c are provided at positions corresponding to bottoms of the cutoff portions 5d. A circular ring-shaped member 5b of this cleaning head 5 may have the same configuration as that of the circular ring-shaped member 5b illustrated in FIGS. 7A to 7C. With this configuration, like the cleaning head 5 of FIGS. 7A to 7C, a cleaning effect by the cutoff portions 5d can be achieved, and the cleaning solution collected in a space between the central member 5a and the circular ring-shaped member 5b can be drained through the pipes 5f, the cutoff portions 5d and the through holes 5h. The number of the pipes 5f and the number of the cutoff portions 5d may be selected appropriately and the through holes 5h may be provided at positions corresponding to a bottom of the opening 5o. Further, the number of the through holes 5h may not be the same as the number of the cutoff portions 5d.

Figure 17A:
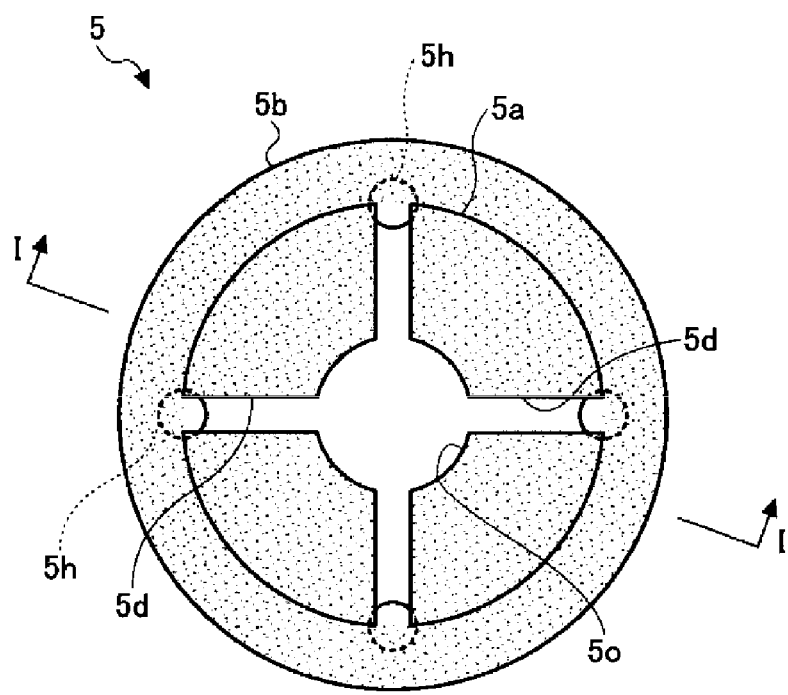
FIGS. 17A and 17B are explanatory diagrams for describing another modification example of the cleaning head in accordance with the embodiment of the present disclosure.
Figure 17B:
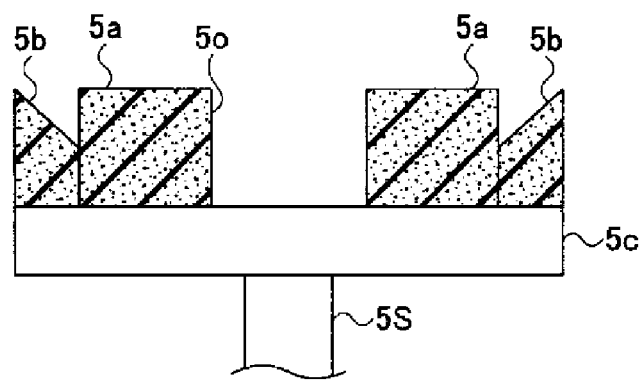

A cleaning head 5 shown in FIGS. 17A and 17B are the same as the cleaning head 5 shown in FIGS. 7A to 7C excepting that a circular ring-shaped member 5b has a different shape. As illustrated in FIGS. 17B, the circular ring-shaped member 5b of this cleaning head 5 has a substantially trapezoid cross-sectional shape, and an inclined surface of this trapezoid-shaped member 5b is in contact with an outer peripheral surface of the central member 5a. With this configuration, an inner peripheral surface (particularly, the inclined surface) of the circular ring-shaped member 5b can come into contact with the beveled portion B of the wafer W to thereby clean the beveled portion B. Further, the cleaning solution collected between a space between a central member 5a and the circular ring-shaped member 5b is discharged from through holes 5h via the central member 5a and the circular ring-shaped member 5b made of sponge. Thus, this configuration is deemed to be very suitable for the case when the amount of the cleaning solution from a cleaning solution nozzle 51a is relatively small.

Figure 18A:
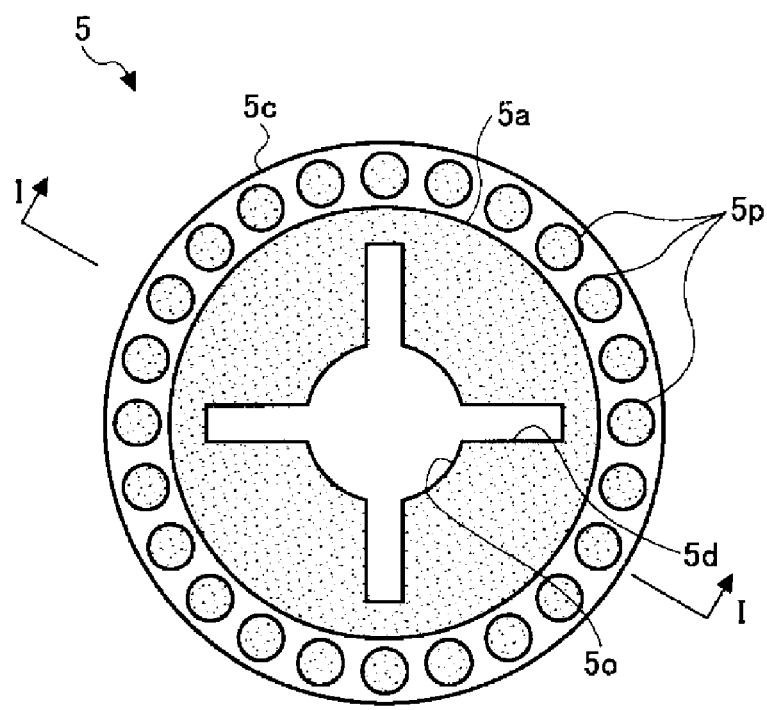
FIGS. 18A and 18B are explanatory diagrams for describing another modification example of the cleaning head in accordance with the embodiment of the present disclosure.
Figure 18B:
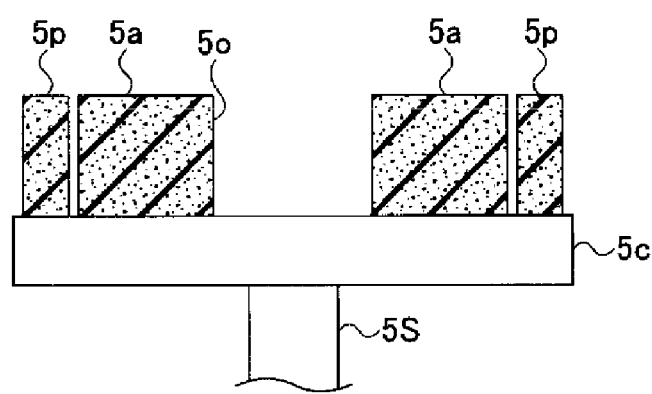

Further, a cleaning head 5 illustrated in FIGS. 18A and 18B may include a central member 5a; a multiple number of pillars 5p provided around the central member 5a; and a base 5c on which the central member 5a and the pillars 5p are mounted. The central member 5a is provided with an opening 5o having a circular shape when viewed from the top and four cutoff portions 5d. Like the central member 5a and the circular ring-shaped member 5b of the cleaning head in FIGS. 7A to 7C, the pillars 5p are also made of PVA. With this configuration, if the cleaning head 5 is located such that a part of the pillars 5p protrude to the outside of the wafer W, the beveled portion B of the wafer W can come into contact with the pillars 5p and the beveled portion B can be cleaned. Further, in such a case, since the cleaning solution can be discharged through gaps between the pillars 5p and a gap between the pillars 5p and the central member 5a, it is not necessary to provide through holes 5h in the base 5c. In addition, since the through holes 5h are not provided, the cutoff portions 5d of the central member 5a are not extended to reach a side surface of the central member 5a.

Figure 19A:
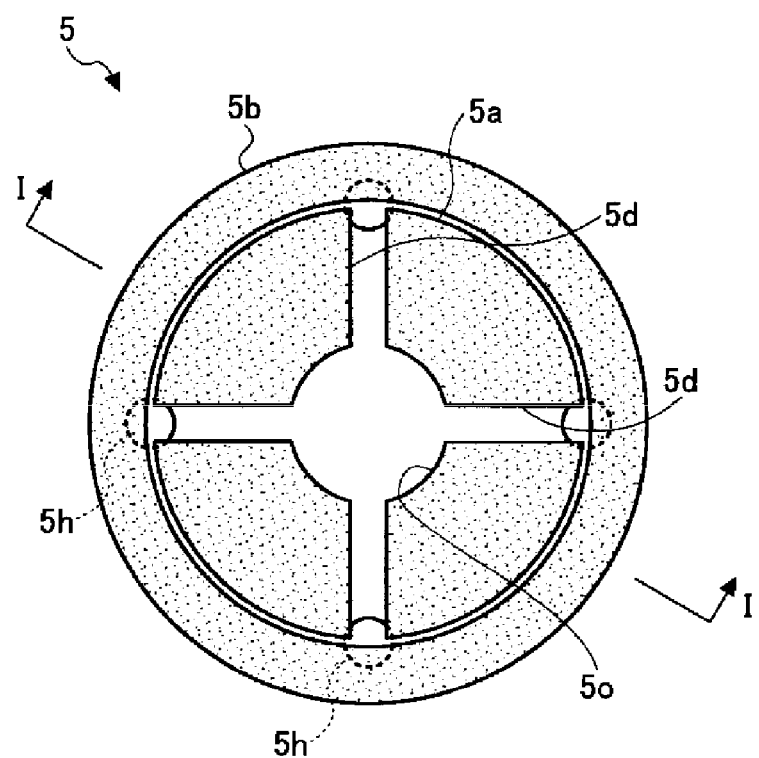
FIGS. 19A and 19B are explanatory diagrams for describing another modification example of the cleaning head in accordance with the embodiment of the present disclosure.
Figure 19B:
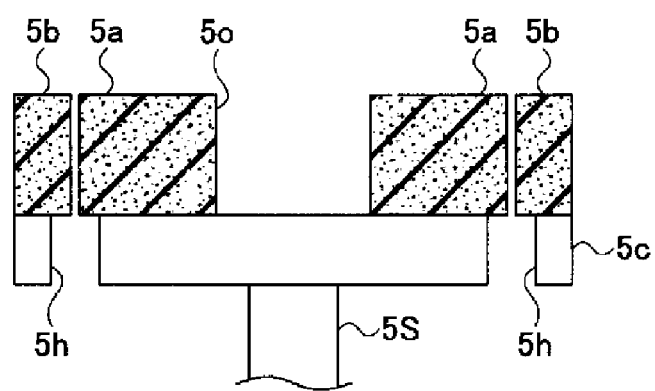

FIGS. 19A and 19B depict another modification example of the cleaning head 5. As shown in the drawings, this cleaning head 5 is the same configuration as the cleaning head 5 shown in FIGS. 7A to 7C excepting that a circular ring-shaped member 5b has a rectangular cross-sectional shape. With this configuration, it is also possible that the beveled portion B of the wafer W is cleaned by the circular ring-shaped member 5b when the circular ring-shaped member 5b partially reaches an edge of the wafer W.

Figure 20:
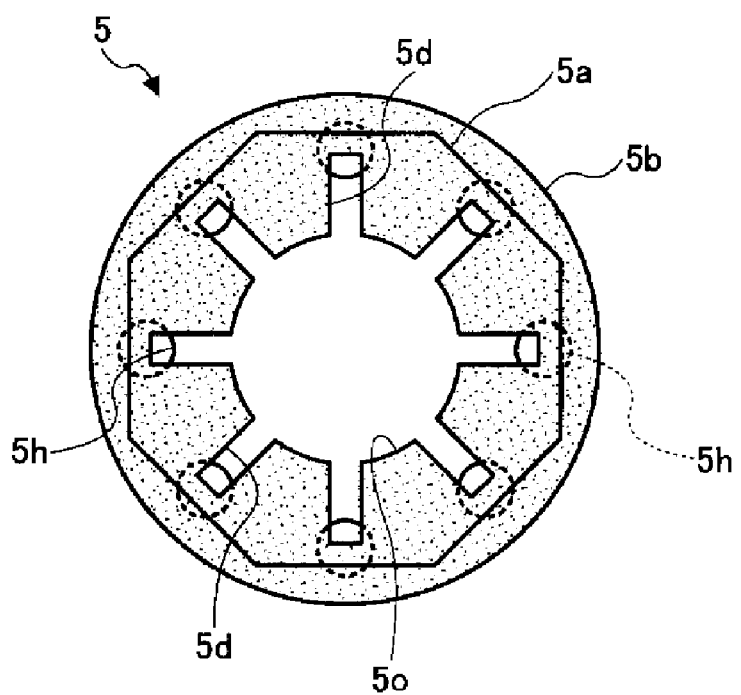
FIG. 20 is an explanatory diagram for describing another modification example of the cleaning head in accordance with the embodiment of the present disclosure.

Furthermore, a cleaning head 5 shown in FIG. 20 may include a central member 5a having an octagonal shape when viewed from the top and a polygonal ring-shaped member 5b disposed around the central member 5a. As in the aforementioned examples, the central member 5a and the polygonal ring-shaped member 5b are mounted on a base 5c. An inner periphery of the polygonal ring-shaped member 5b also has an octagonal shape conforming to the shape of an outer periphery of the central member 5a and is in contact with the outer periphery of the central member 5a. When the polygonal ring-shaped member 5b having such a shape comes into contact with the beveled portion B of the wafer W, a contact area and a contact force may be varied along the inner periphery of the polygonal ring-shaped member 5b, so that cleaning efficiency may be improved.

Furthermore, the cleaning head 5 may be composed of a brush including a multiple number of plastic threads, not a sponge. Desirably, the plastic thread may be made of, e.g., polyvinyl chloride (PVC), urethane, nylon, or the like. Further, both of or either one of the central member 5a and the circular ring-shaped member 5a may be composed of the brush. Further, when the circular ring-shaped member 5b is composed of the brush, the inner peripheral surface of the circular ring-shaped member 5b in contact with the side surface of the central member 5a may be inclined as illustrated in FIG. 7B.

Figure 21A:
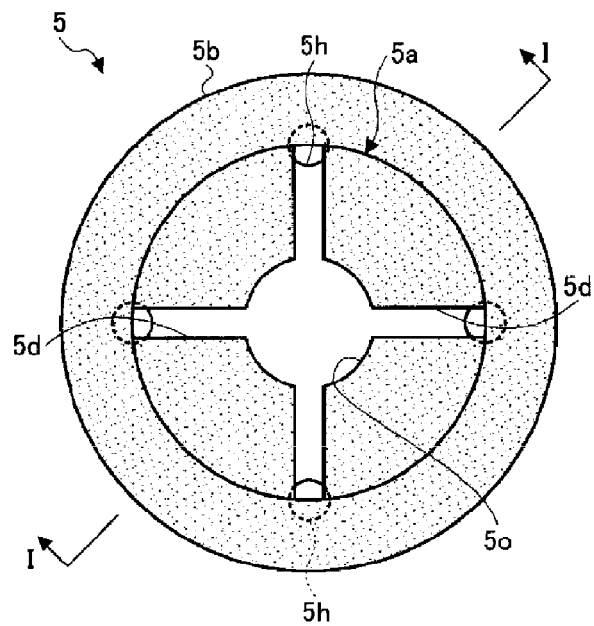
FIGS. 21A to 21C are explanatory diagrams for describing another modification example of the cleaning head in accordance with the embodiment of the present disclosure.
Figure 21B:
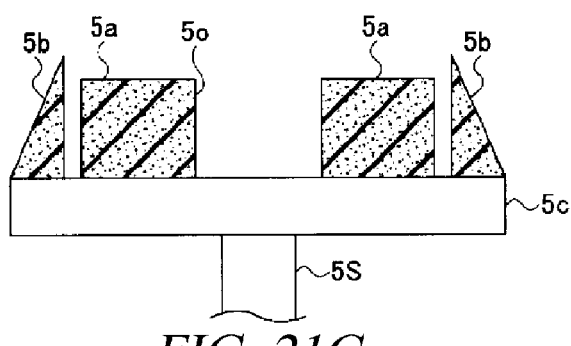
Figure 21C:
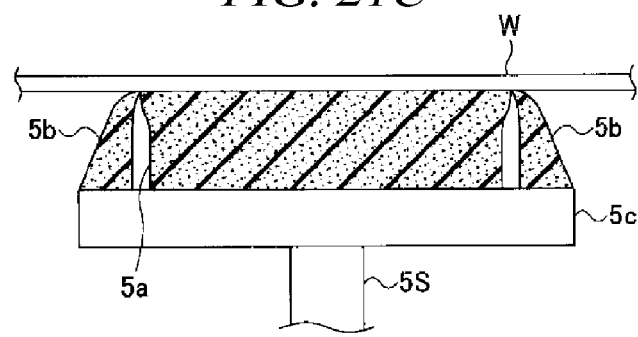

Moreover, FIGS. 21A and 21B illustrate a cleaning head 5 in accordance with still another modification example. An inner peripheral surface of a circular ring-shaped member 5b stands uprightly to a base 5c and an outer peripheral surface of the circular ring-shaped member 5b is inclined outward. Excepting this configuration, the cleaning head 5 in accordance with this modification example has the same configuration as that of the cleaning head 5 shown in FIGS. 7A to 7C. To elaborate, the outer peripheral surface of the circular ring-shaped member 5b is inclined such that its outer diameter decreases in an upward direction (i.e., in a direction away from the base 5c). With such a shape, an upper portion of the circular ring-shaped member 5b may be thinner than a lower portion thereof and may have an appropriate degree of flexibility. Thus, the circular ring-shaped member 5b can be pressed against the beveled portion B (see FIGS. 12B and 12C) at an appropriate pressure. As a result, a cleaning effect of the beveled portion B may be improved. Furthermore, when the rear surface of the wafer W is cleaned by the cleaning head 5 having such a shape, the circular ring-shaped member 5b may be pressed inward as illustrated in FIG. 21C when it is pressed against the rear surface of the wafer W. Accordingly, after the cleaning head 5 is used for a relatively long period of time, the upper portion of the circular ring-shaped member 5b may be deformed inwardly. In such a case, even if the cleaning head 5 is used for a long period of time, the beveled portion B can be sufficiently pressed against the inner peripheral surface of the circular ring-shaped member 5b when the cleaning head 5 reaches the beveled portion B and the circular ring-shaped member 5b partial protrudes. That is, a cleaning effect for the beveled portion B can be continued for a long period of time, this cleaning head 5 has an advantaged of long lifetime.

Further, a height of the circular ring-shaped member 5b may be higher than a height of the central member 5a. To be specific, assume that the height of the circular ring-shaped member 5b (from the base 5c) is Hb and the height of the central member 5a (from the base 5c) is Ha, it may be desirable that 0≤Hb−Ha≤about 2 mm and, more desirably, about 1 mm≤Hb−Ha≤about 2 mm. If the circular ring-shaped member 5b is higher than the central member 5a, the circular ring-shaped member 5b can reach a position higher than the front surface of the wafer W even in case that a pressure from the cleaning head 5 toward the rear surface of the wafer W is weak. Thus, it is possible to clean the entire beveled portion B. Even in case that the central member 5a and/or the circular ring-shaped member 5b include a brush, desirably, the circular ring-shaped member 5b may be higher than the central member 5a.

In addition, desirably, the circular ring-shaped member 5b may have higher flexibility than that of the central member 5a so as to allow the inner peripheral surface of the circular ring-shaped member 5b to be easily deformed by the beveled portion B.

Further, in case that the central member 5a and/or the circular ring-shaped member 5b are made of a sponge, the sponge may be PVA but another type of sponge may also be used.

Furthermore, the central member 5a of the cleaning head 5 may not necessarily have the opening 5o and the cutoff portions 5d. However, since a linear velocity according to the rotation of the cleaning head 5 is small at a central portion (in the vicinity of a central axis of rotation) of the central member 5a, a cleaning effect by the central portion of the central member 5a is lower than cleaning effects by a peripheral portion of the central member 5a and the circular ring-shaped member 5b. For this reason, providing the opening 5o may be desirable. Further, since the presence of the cutoff portions 5d improves the cleaning effect, it may be possible to provide only the cutoff portions 5d without providing the opening 5o. In such a case, cross-shaped cutoff portions may be desirable, for example.

Moreover, an elevating unit the same as, e.g., the elevating unit 27 of the side plate 26 (FIG. 3) may be provided at the support 51 to which the cleaning head 5 is secured, and approach of the cleaning head 5 toward the rear surface of the wafer W and a pressure therefor may be controlled by using the support 51. In such a case, the driving unit 33 of the spin chuck 3 may only have a function of rotating the spin chuck 3. Further, if both the support 51 of the cleaning head 5 and the driving unit 33 of the spin chuck 3 are configured to be movable up and down and, the approach of the cleaning head 5 toward the rear surface of the wafer W and the pressure therefor may be controlled by the cooperation of the support 51 and the driving unit 33.

Moreover, the support 51 to which the cleaning head 5 is secured may be configured to be extensible and contractible and the cleaning head 5 may be moved in the X direction shown in FIG. 4. With this configuration, by moving the cleaning head 5 in a direction along the rear surface of the wafer W, the rear surface of the wafer W and the beveled portion B can be cleaned. In such a case, it may be also possible to control the support 51 to be movable in the Y direction.

In addition, after the beveled portion B is cleaned by the cleaning head 5 in the substrate cleaning apparatus 100, the beveled portion B may be additionally cleaned by using a cleaning solution. For the purpose, the bevel cleaning nozzle 7 for cleaning the beveled portion B may be provided at the upper cup 41, as illustrated in FIG. 5. The bevel cleaning nozzle 7 is configured to discharge the cleaning solution such as DIW for cleaning the beveled portion B to thereby wash away particles adhering to the beveled portion B. To elaborate, the bevel cleaning nozzle 7 may include an upper nozzle 71 configured to discharge the cleaning solution toward a upper portion of the beveled portion B in an inclined direction from the outside of and above the wafer W; and a lower nozzle 72 configured to discharge the cleaning solution toward a lower portion of the beveled portion B in an inclined direction from the outside of and below the wafer W. While the wafer W is being rotated by the spin chuck 3, the cleaning solution may be discharged toward the beveled portion B from the upper and lower nozzles 71 and 72. Accordingly, the particles adhering to the beveled portion B may be eliminated by the impact force of the cleaning solution. In such a case, since the wafer W is rotated, the cleaning solution can be distributed to the entire beveled portion B and then the cleaning solution can be dispersed away from the beveled portion B by a centrifugal force generated by the rotation of the wafer W. Accordingly, the particles can be flown away from the beveled portion B.

Furthermore, in the substrate cleaning apparatus 100 may be additionally provided with a rear surface periphery cleaning nozzle 8 for cleaning a periphery of the rear surface of the wafer W (see FIGS. 3 to 5). The periphery of the rear surface of the wafer W may be affected by a hydrophobicizing agent used in the hydrophobicizing process performed before forming the photoresist film. That is, in the hydrophobicizing process, the hydrophobicizing agent may flow to the periphery of the rear surface of the wafer W from the beveled portion B thereof. In such a case, the periphery of the rear surface of the wafer W becomes to have hydrophobic property. Accordingly, it may be useful to supply a cleaning solution from the rear surface periphery cleaning nozzle 8 because the rear surface and the beveled portion B of the wafer W can be maintained wet and particles removed by the cleaning head can be washed away.

To be more specific, desirably, the rear surface periphery cleaning nozzle 8 may be, by way of example, a double fluid nozzle and the cleaning solution for cleaning the periphery of the rear surface of the wafer W may be a mixture of DIW and a $N_2$ gas. That is, a liquid component (DIW) and a gas component ($N_2$) may be mixed at or near a leading end of the double fluid nozzle and it may be desirable to discharge this mixture to the rear surface of the wafer W. With such a configuration, particles can be securely eliminated by impact forces of DIW and nitrogen bubbles. Further, the rear surface periphery cleaning nozzle 8 may be configured to be movable up and down by an elevating unit 81. With this configuration, when the wafer W is shifted horizontally by the attraction pads 2, the rear surface periphery cleaning nozzle 8 may be lowered down so as to not to interfere with the upper cup 41, the air knife 31 and the like.

Moreover, as illustrated in FIG. 5, the bevel cleaning nozzles 71 and 72 may be connected with the cleaning solution source 65 via the supply line 7a having the flow rate control unit 7b, and the rear surface periphery cleaning nozzle 8 may be connected with the cleaning solution (DIW) source 65 and the nitrogen gas source 66 via the supply lines 81a and 82a having the flow rate control units 81b and 82b, respectively.

Further, in the above-described embodiment, although the substrate cleaning apparatus 100 is provided in the first transfer chamber 126 of the interface block B3, the present disclosure may not be limited thereto. By way of example, the substrate cleaning apparatus 100 may be disposed in the processing unit set U4 or U5 or in the shelf unit U1, U2 or U3 within the processing block B2.

So far, although the present disclosure has been described for the case of cleaning the semiconductor wafer W, the present disclosure can also be applied to cleaning a FPD substrate or the like.

What is claimed is:

1. A substrate cleaning apparatus comprising:
a substrate holding and rotating unit configured to hold a central portion of a rear surface of a substrate and rotate the substrate;
a cleaning unit including a first cleaning member, a second cleaning member provided around the first cleaning member and a base to which the first cleaning member and the second cleaning member are secured;
an elevating unit configured to move the substrate holding and rotating unit and the cleaning unit relative to each other so as to allow the first cleaning member and the second cleaning member to come into contact with the rear surface of the substrate held by the substrate holding and rotating unit; and
a driving unit configured to drive the substrate and the cleaning unit relative to each other in a direction along the rear surface of the substrate so as to allow a part of the second cleaning member to be exposed to the outside of the substrate.

2. The substrate cleaning apparatus of claim 1, wherein the first cleaning member has a cylindrical shape and the second cleaning member provided around the cylindrical first cleaning member has a circular ring shape.

3. The substrate cleaning apparatus of claim 2, wherein the circular ring-shaped second cleaning member has an inclined inner peripheral surface such that a gap between the circular ring-shaped second cleaning member and the cylindrical first cleaning member is enlarged in a direction away from the base.

4. The substrate cleaning apparatus of claim 2, wherein the first cleaning member has an opening formed at a central portion thereof and/or a cutoff portion communicating with the opening.

5. The substrate cleaning apparatus of claim 2, wherein the base is provided with a through hole penetrating the base.

6. The substrate cleaning apparatus of claim 5, wherein the first cleaning member has an opening formed at a central portion thereof and/or a cutoff portion communicating with the opening, and
the through hole is provided below the cutoff portion and below a boundary between the first cleaning member and the second cleaning member.

7. The substrate cleaning apparatus of claim 2, wherein a height of the second cleaning member from the base is higher than a height of the first cleaning member from the base.

8. The substrate cleaning apparatus of claim 2, further comprising a rotating unit configured to rotate the cleaning unit.

9. The substrate cleaning apparatus of claim 2, further comprising a cleaning solution supply unit configured to supply a cleaning solution to the rear surface of the substrate.

10. The substrate cleaning apparatus of claim 1, wherein the first cleaning member has an opening formed at a central portion thereof and/or a cutoff portion communicating with the opening.

11. The substrate cleaning apparatus of claim 1, wherein the base is provided with a through hole penetrating the base.

12. The substrate cleaning apparatus of claim 11, wherein the first cleaning member has an opening formed at a central portion thereof and/or a cutoff portion communicating with the opening, and
the through hole is provided below the cutoff portion and below a boundary between the first cleaning member and the second cleaning member.

13. The substrate cleaning apparatus of claim 1, wherein a height of the second cleaning member from the base is higher than a height of the first cleaning member from the base.

14. The substrate cleaning apparatus of claim 1, further comprising a rotating unit configured to rotate the cleaning unit.

15. The substrate cleaning apparatus of claim 1, further comprising a cleaning solution supply unit configured to supply a cleaning solution to the rear surface of the substrate.

16. A coating and developing apparatus comprising:
a photoresist film forming unit configured to form a photoresist film on a substrate;
a substrate cleaning apparatus, as claimed in claim 1, configured to clean the substrate on which the photoresist film is formed; and
a developing unit configured to develop the photoresist film after the photoresist film is exposed to light.

17. A substrate cleaning method comprising:
holding a central portion of a rear surface of a substrate and rotating the substrate;
allowing a first cleaning member and a second cleaning member provided around the first cleaning member to come into contact with the rear surface of the substrate; and
moving the substrate and the first and second cleaning members relative to each other in a direction along the rear surface of the substrate so as to allow a part of the second cleaning member to be exposed to the outside of the substrate.

18. The substrate cleaning method of claim 17, further comprising:
supplying a cleaning solution to the rear surface of the substrate.

19. The substrate cleaning method of claim 18, further comprising:
rotating the first and second cleaning members.

20. The substrate cleaning method of claim 17, further comprising:
rotating the first and second cleaning members.

* * * * *